United States Patent [19]

Saito et al.

[11] Patent Number: 5,342,452
[45] Date of Patent: Aug. 30, 1994

[54] PHOTOVOLTAIC DEVICE

[75] Inventors: Keishi Saito; Tatsuyuki Aoike, both of Nagahama, Japan

[73] Assignee: Canon Kabushiki Kaisha, Tokyo, Japan

[21] Appl. No.: 949,692

[22] Filed: Sep. 23, 1992

[30] Foreign Application Priority Data

Sep. 25, 1991 [JP] Japan .................. 3-245803
Dec. 12, 1991 [JP] Japan .................. 3-351521

[51] Int. Cl.$^5$ ................. H01L 31/0224; H01L 31/075
[52] U.S. Cl. ..................... 136/256; 136/258; 257/53; 257/55; 257/458; 257/741
[58] Field of Search ......... 136/256, 258 AM, 258 PC; 257/53, 55, 458, 741

[56] References Cited

U.S. PATENT DOCUMENTS

| | | | |
|---|---|---|---|
| 4,689,093 | 8/1987 | Ishihara et al. | 437/5 |
| 5,057,244 | 10/1991 | Nitta et al. | 252/501.1 |
| 5,085,711 | 2/1992 | Iwamoto et al. | 136/258 |

FOREIGN PATENT DOCUMENTS

| | | | |
|---|---|---|---|
| 3438437 | 2/1985 | Fed. Rep. of Germany | C03C 17/22 |
| 3718789 | 10/1987 | Fed. Rep. of Germany | C23C 16/40 |
| 60-142575 | 7/1985 | Japan | 136/258 AM |
| 61-139074 | 6/1986 | Japan | 136/258 AM |
| 54-134396 | 10/1992 | Japan | |

OTHER PUBLICATIONS

Patent Abstracts of Japan, vol. 15, No. 233 (E-1077) Jun. 14, 1991.
Patent Abstracts of Japan, vol. 3, No. 153 (E-159) Dec. 15, 1979.
Tech. Dig. of Int. PVSE C-5, pp. 367-370, Nov. 1990, Ashida, et al.
Tech. Dig. of Int. PVSE C-5, pp. 253-256, Nov. 1990, LeBlanc, et al.
Data Base WP1 Week 9308, Derwent Publ. Ltd, AN9-3-06 3558.

*Primary Examiner*—Aaron Weisstuch
*Attorney, Agent, or Firm*—Fitzpatrick, Cella, Harper & Scinto

[57] ABSTRACT

A photovoltaic device includes a conductive substrate, a semiconductor layer formed on the conductive substrate and made of a non-single-crystal semiconductor material containing at least silicon atoms, and a transparent electrode stacked on the semiconductor layer, wherein the transparent electrode is made of a conductive oxide containing carbon atoms, nitrogen atoms, or both and the carbon and/or nitrogen atoms are contained in larger quantities in the portion of the transparent electrode adjacent to the semiconductor layer.

25 Claims, 5 Drawing Sheets

PHOTOVOLTAIC DEVICE

BACKGROUND OF THE INVENTION

1. Field of the Invention

The present invention relates to a photovoltaic device for use in a solar battery, a photosensor, or the like, the photovoltaic device being constituted by stacking a semiconductor layer made of non-single-crystal semiconductor material, which contains silicon atoms, and a transparent electrode made of an indium oxide, a tin oxide, an indium-tin oxide or the like. More particularly, the present invention relates to a photovoltaic device made of amorphous silicon type semiconductor material (fine crystal silicon type semiconductor material included) or polycrystal silicon type semiconductor material as the non-single-crystal semiconductor material.

2. Related Background Art

A transparent electrode is an important component which relates to the performance of a photovoltaic device. Hitherto, the transparent electrode has been made of an indium oxide, a tin oxide, or an indium-tin oxide formed into a film by depositing the employed material by spraying, vacuum evaporating, ion plating, sputtering or the like.

The light transmissivity and the specific resistance of the transparent electrode, thus formed, are parameters which directly relate to the performance of the photovoltaic device. Also conditions under which the transparent electrode is deposited, for example, the temperature of the substrate, the degree of vacuum, the deposition speed, and the like are important parameters which affect the quality of the semiconductor layer which is positioned adjacent to the transparent electrode.

Results of a study of the relationship between the photovoltaic device and the transparent electrode have been recently disclosed in "Optical Absorption of Transparent Conducting Oxides and Power Dissipation in a-Si:H pin Solar Cells Measured by Photothermal Deflection Spectroscopy," by F LeBlanc and J. Perrin et al., *Technical Digest of the International PVSEC-5*, Kyoto, Japan, 1990, pg. 253, and "Improvement of Interface Properties of TCO/p-layer in pin-type Amorphous Silicon Solar Cells," by Y. Ashida, N. Ishida, and N. Ishiguro et al., *Technical Digest of the International PVSEC-5*, Kyoto, Japan, 1990, pg. 367.

Furthermore, a method of reducing the resistance of the transparent electrode by stacking an indium oxide film and a tin oxide film has been disclosed in Japanese Laid-Open Patent Application No. 54-134396.

However, there is a desire to further reduce the resistance of the conventional transparent electrode composed of indium oxide, tin oxide, or indium-tin oxide.

Furthermore, the transmissivity, the photovoltaic force, and the photoelectric current must be further improved.

Since photovoltaic devices have been widely used recently in a variety of conditions, a separation has taken place between the transparent electrode and the layer which is positioned in contact with the transparent layer, depending upon the conditions of use.

In addition, the problem of short circuits may arise when the photovoltaic device is repeatedly subjected to a heat cycle for an excessively long time.

SUMMARY OF THE INVENTION

An object of the present invention is to overcome the aforementioned problems experienced with the conventional photovoltaic device.

Another object of the present invention is to provide a photovoltaic device having a transparent electrode free from distortion and exhibiting large photovoltaic force and photoelectric current.

Another object of the present invention is to provide a photovoltaic device having a uniform non-single-crystal semiconductor layer, which is deposited on a transparent electrode thereof, and which is free from abnormal deposition.

Another object of the present invention is to provide a photovoltaic device exhibiting stable characteristics.

Another object of the present invention is to provide a photovoltaic device which is free from separation of the layers thereof because the structural distortion between the transparent electrode and the semiconductor layer adjacent to the transparent electrode can be considerably prevented.

Another object of the present invention is to provide a photovoltaic device which can be manufactured with a satisfactory manufacturing yield.

As a result of a study to overcome the aforementioned problems and to achieve the aforementioned objects, the following optimum structure was found.

Therefore, according to the present invention, there is provided a photovoltaic device having a conductive substrate on which semiconductor layers composed of a p-type layer, an i-type layer, and an n-type layer made of non-single-crystal semiconductor materials which contain at least silicon atoms are stacked, and also having a transparent electrode stacked on the semiconductor layers, wherein the transparent electrode is made of an oxide such as an indium oxide, a tin oxide, or an indium-tin oxide which contains carbon and/or nitrogen atoms, and the carbon and/or nitrogen atoms are distributed in the transparent electrode in the region adjacent to the semiconductor layer in a larger quantity than in a region opposite to the semiconductor layer.

DETAILED DESCRIPTION OF THE PREFERRED EMBODIMENTS

Preferred embodiments of the present invention will now be described. However, the present invention is not limited to the descriptions made hereinafter.

Figure 1:
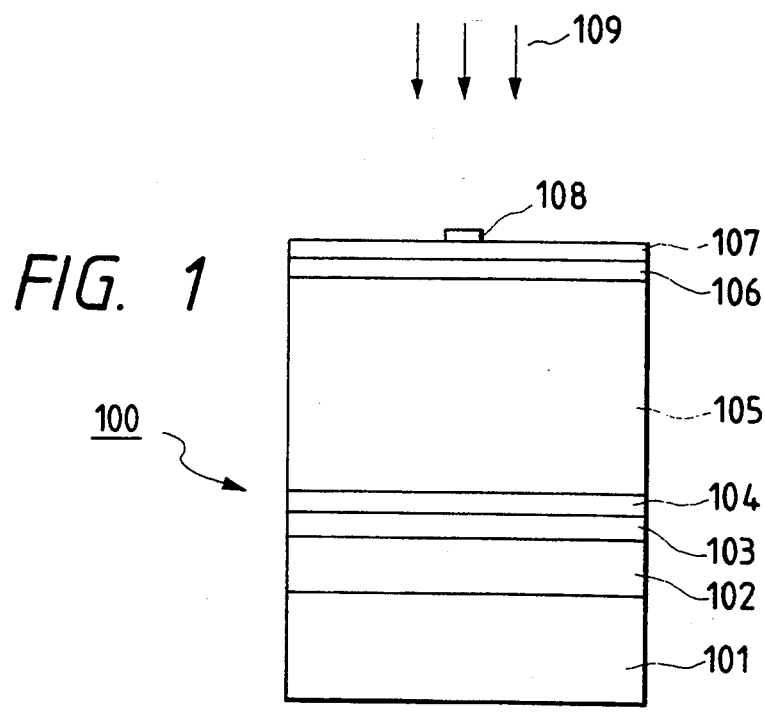
FIG. 1 is a schematic structural view which illustrates the structure of the layers of a photovoltaic device according to the present invention.
Figure 2:
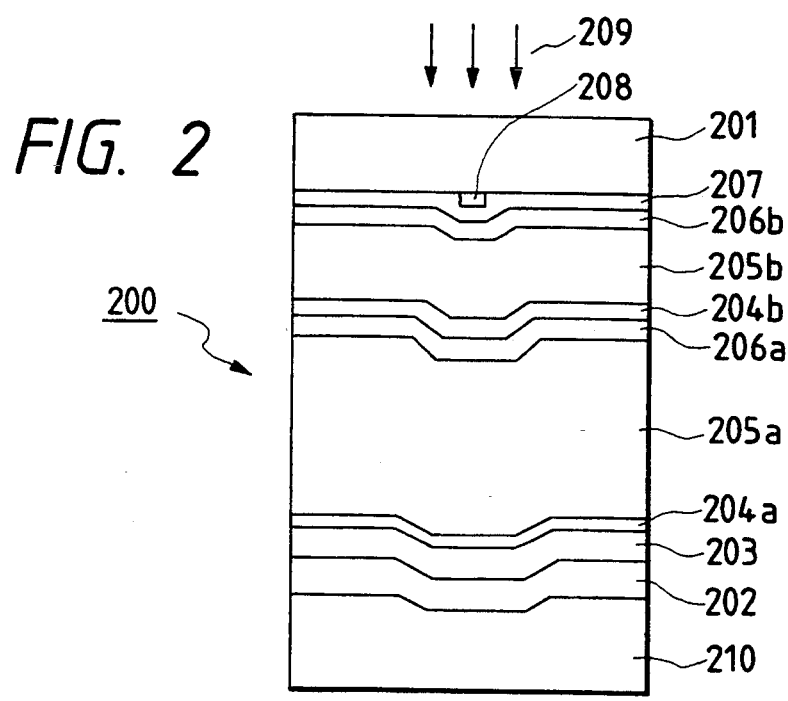
FIG. 2 is a schematic structural view which illustrates the structure of the layers of another photovoltaic device according to the present invention, wherein a device having a structure similar to that of a conventional photovoltaic device is illustrated.

FIGS. 1 and 2 are schematic views which illustrate photovoltaic devices 100, 200 according to the present invention.

The photovoltaic device 100 according to the present invention is, as shown in FIG. 1, composed of an opaque and conductive substrate 101 having, in order on the upper surface thereof, a light reflective (conductive) layer 102, a reflection promoting layer 103, an n- or p-type non-single-crystal silicon semiconductor layer 104, an i-type (substantially intrinsic) non-single-crystal silicon semiconductor layer 105, a p- or n-type non-single-crystal silicon semiconductor layer 106, a transparent electrode 107 containing carbon atoms, nitrogen atoms, or carbon and nitrogen atoms in a relatively larger quantity in the region adjacent to the semiconductor layer, and a current collecting electrode 108. The photovoltaic device, thus constituted, is irradiated with light 109 incident from above the transparent electrode 107.

The photovoltaic device 200 according to the present invention and shown in FIG. 2 is formed in a tandem structure composed of a transparent superstrate 201 having, on the lower surface thereof, a current collecting electrode 208, a transparent electrode 207 containing carbon atoms, nitrogen atoms, or carbon and nitrogen atoms in a relatively larger quantity in the region adjacent to the semiconductor layer, a p- or n-type non-single-crystal silicon semiconductor layer 206b, an i-type (substantially intrinsic) non-single-crystal silicon semiconductor layer 205b, an n- or p-type silicon semiconductor layer 204b, a p- or n-type non-single-crystal silicon semiconductor layer 206a, an i-type (substantially intrinsic) non-single-crystal silicon layer 205a, an n- or p-type non-single-crystal silicon semiconductor layer 204a, a reflection promoting layer 203, a light reflective (conductive) layer 202, and a conductive (and/or protection) layer 210. The photovoltaic device 200, thus constituted, is irradiated with light 209 incident from above the transparent superstrate 201.

Furthermore, a triple-type photovoltaic device formed by stacking three pin units is also adaptable to the present invention, although omitted from illustration.

Transparent Electrode

The photovoltaic device according to the present invention has a transparent electrode in which carbon atoms, nitrogen atoms, or carbon and nitrogen atoms are contained in a tin oxide, an indium oxide, or an indium-tin oxide.

The transparent electrode, in which carbon atoms, nitrogen atoms, or carbon and nitrogen atoms are contained in a tin oxide, an indium oxide, or an indium-tin oxide, has characteristics such that the crystal particle size of the oxide, which constitutes the transparent electrode, is enlarged, and dispersion of the crystal particle size range is reduced. Furthermore, the presence of the carbon atoms or the nitrogen atoms in the transparent electrode will prevent distortion of the transparent electrode. As a result, the specific resistance of the transparent electrode is reduced and the transmissivity improved.

Furthermore, the fact that the transparent electrode contains the carbon atoms or the nitrogen atoms will smooth the shape of the crystals of the aforementioned oxide which forms the transparent electrode, causing the surface property (for example, the smoothness) of the transparent electrode to be improved. In particular, when the transparent electrode is formed on the semiconductor layer, the distortion between the semiconductor layer and the transparent electrode can be reduced, causing the adhesion between them to be significantly improved. In addition, abnormal deposition of the non-single-crystal silicon semiconductor layer can be reduced when the non-single-crystal silicon semiconductor layer is deposited on the transparent electrode. Hence, even if a thin p- or n-type layer is deposited, a leakage current can be reduced. Therefore, average characteristics of the photovoltaic device can be improved.

Furthermore, since a relatively larger quantity of the carbon or nitrogen atoms is distributed in the region of the transparent electrode adjacent to the semiconductor layer, the structural distortion due to the difference in material between the transparent electrode and the semiconductor layer can be reduced.

It is preferable that the distribution of the carbon atoms or the nitrogen atoms contained in the transparent electrode be decreased in an exponential manner from a position adjacent to the boundary between the transparent electrode and the semiconductor layer toward the inside portion of the transparent electrode. The fact that the carbon atoms or the nitrogen atoms in the transparent electrode are decreased in the exponential manner will further reduce the structural distortion due to the difference in material between the transparent electrode and the semiconductor layer. Furthermore, changes due to the dispersion of the carbon atoms or the nitrogen atoms with time can be minimized.

It is preferable that the range in which the carbon atoms or the nitrogen atoms are distributed in the exponential manner be from 3 nm to 50 nm.

In the transparent electrode according to the present invention containing carbon atoms or nitrogen atoms, the temperature at which a satisfactory quality transparent electrode can be formed is lowered since the carbon atoms affect the growth of the crystals of the oxide, although the details have not been clarified yet. Therefore, excellent characteristics can be obtained even if the temperature is at a relatively low level.

The transparent electrode containing the carbon atoms or the nitrogen atoms according to the present invention is deposited as follows.

An optimum deposition method to deposit the transparent electrode containing the carbon atoms or the nitrogen atoms according to the present invention is sputtering or vacuum evaporation.

Figure 3:
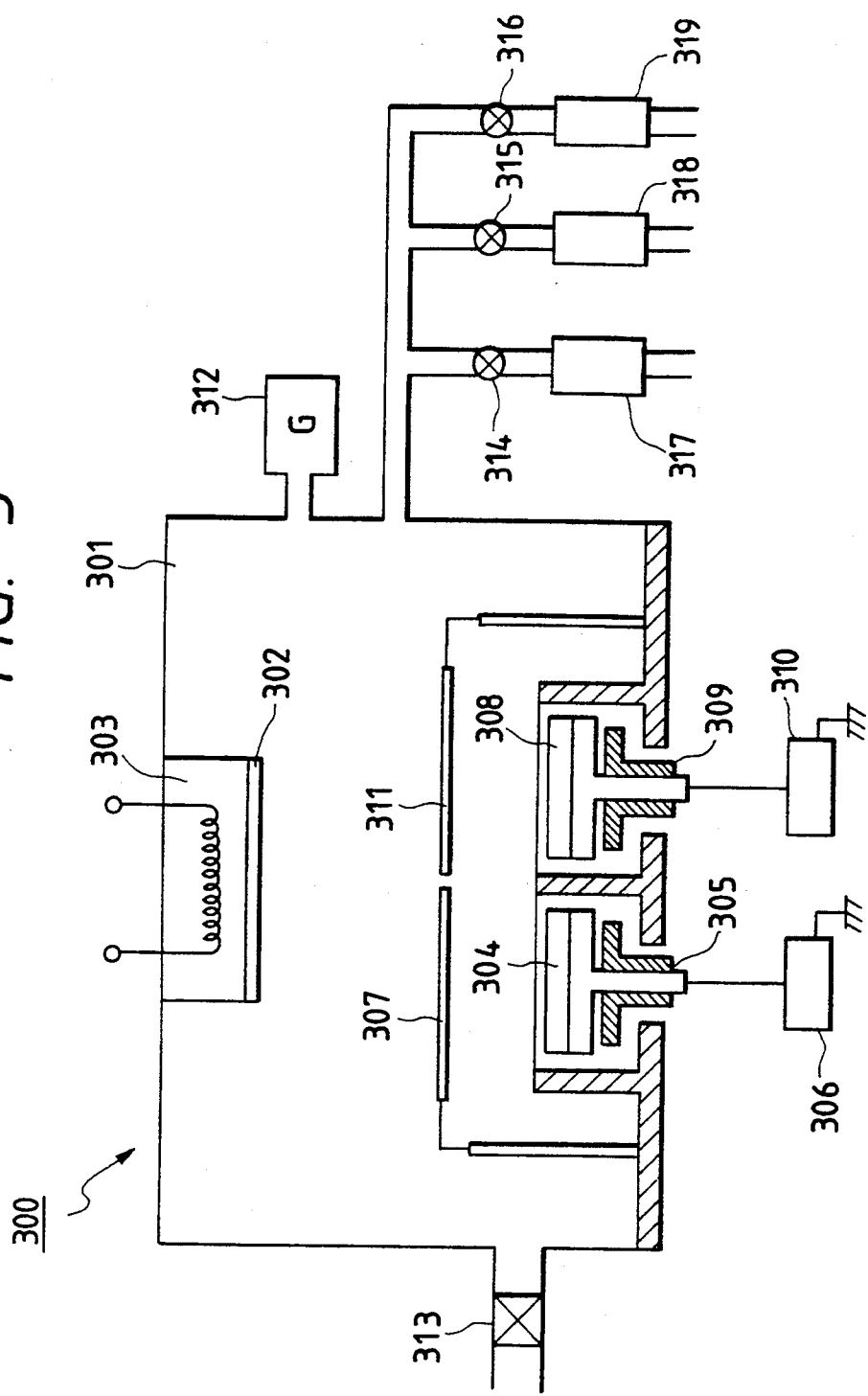
FIG. 3 is a schematic view which illustrates an example of an apparatus for manufacturing a transparent electrode for the photovoltaic device according to the present invention, wherein a manufacturing apparatus adapted to perform a DC magnetron sputtering method is illustrated.

Furthermore, DC magnetron sputtering apparatus 300 schematically shown in FIG. 3 exemplifies a sputtering apparatus suitable to deposit the transparent electrode containing carbon atoms or nitrogen atoms according to the present invention.

The DC magnetron sputtering apparatus 300 is composed of a deposition chamber 301, a substrate 302, a heater 303, targets 304 and 308, insulating supporting members 305 and 309, DC power sources 306 and 310, shutters 307 and 311, a vacuum gauge 312, a conductance valve 313, gas introduction valves 314, 315, and 316, and mass flow controllers 317, 318, and 319.

When a transparent electrode made of a tin oxide containing carbon atoms or nitrogen atoms according to the present invention is deposited on a substrate by using the DC magnetron sputtering apparatus 300, the target comprises carbon atoms or nitrogen atoms contained in metallic tin (Sn) or tin oxide ($SnO_2$).

When the transparent electrode according to the present invention is made of an indium oxide containing carbon atoms or nitrogen atoms, the target is made from a material which comprises carbon atoms or nitrogen atoms contained in metallic indium (In) or an indium oxide ($In_3O_3$).

When the transparent electrode according to the present invention is made of indium-tin oxide containing carbon atoms or nitrogen atoms, the target is made by combining metallic tin, metallic indium, a tin-indium metal alloy, a tin oxide, an indium-tin oxide, and an indium-tin oxide which contains carbon atoms or nitrogen atoms. If an arrangement is made such that a plurality of targets having different carbon or nitrogen atom contents are prepared and the aperture ratio of a shutter which corresponds to the target can be changed, the distribution of the content of the carbon or nitrogen atoms in the transparent electrode can be changed.

As a starting material for generating carbon atoms to be contained by the target, graphitic carbon or diamond-shaped carbon is suitable.

When the transparent electrode according to the present invention is deposited by a reactive sputtering method, the following process can be employed in which the aforementioned target and/or a target which does not contain carbon atoms or nitrogen atoms are combined and a raw material gas containing carbon atoms or nitrogen atoms is introduced into the deposition chamber or the nitrogen atoms are introduced into the transparent electrode by utilizing plasma energy. In this case, the distribution of the carbon atoms or the nitrogen atoms in the transparent electrode can be controlled by changing the quantity of the raw material gas which contains the carbon atoms or the nitrogen atoms introduced into the deposition chamber.

Raw material gases containing carbon atoms which can be adapted to the reactive sputtering method are exemplified by $CH_4$, $CD_4$, $C_nH_{2n+2}$ (n is an integer), $C_nH_{2n}$ (n is an integer), $C_2H_2$, $C_6H_6$, $CO_2$, $CO$, and the like.

As raw material gases containing nitrogen atoms which can be adapted to the reactive sputtering method, $N_2$, $NH_3$, $ND_3$, $NO$, $NO_2$, $N_2O$, and the like are exemplified.

It is preferable to make the maximum distribution density of carbon atoms or nitrogen atoms contained in the transparent electrode according to the present invention in the range from 5 ppm or more to 1000 ppm or less. Furthermore, it is preferable that the maximum quantity of carbon atoms or nitrogen atoms contained in the aforementioned target be 1000 ppm in order to cause the carbon atoms or the nitrogen atoms contained by the transparent electrode to be distributed in the maximum distribution density range from 5 ppm or more to 1000 ppm or less, although it depends considerably on the sputtering conditions.

In order to cause carbon atoms or nitrogen atoms to be contained by the transparent electrode in the maximum distribution density of 1000 ppm or less by the sputtering method, it is preferable that the maximum amount of the gas containing carbon atoms or nitrogen atoms to be mixed with the sputtering gas be about 2000 ppm or less.

In the case where the transparent electrode containing carbon atoms or nitrogen atoms is deposited by the sputtering method, the temperature of the substrate is an important factor and is preferably in a range from 25° C. to 600° C. In particular, the transparent electrodes containing carbon atoms or nitrogen atoms, according to the present invention, exhibit excellent characteristics in comparison with the conventional technology in a temperature range from 25° C. to 250° C. Furthermore, the sputtering gas for use in the case where the transparent electrode containing carbon atoms or nitrogen atoms, according to the present invention, is deposited by the sputtering method is an inert gas exemplified by argon (Ar), neon (Ne), xenon (Xe), helium (He), or the like. In particular, it is most preferable to employ Ar. In addition, it is preferable to add oxygen ($O_2$) to the inert gas if necessary. In particular, the oxygen ($O_2$) is required in the case where the target is made of metal.

In the case where the target is sputtered by the inert gas or the like, it is preferable to make the pressure in the discharge space in the range from 0.1 to 50 mTorr in order to effectively perform the sputtering operation.

In addition, a DC or an RF power supply is preferred as the power source to be employed in the sputtering method. A preferred electric power is 10 to 1000 W during sputtering.

An optimum deposition speed at which the transparent electrode containing carbon atoms or nitrogen atoms is formed according to the present invention is in the range from 0.01 to 10 nm/sec, although it depends upon the pressure and the electric discharge power in the discharge space.

The second method adaptable to depositing the transparent electrode containing carbon atoms or nitrogen atoms, according to the present invention, is the vacuum evaporation method.

Figure 5:
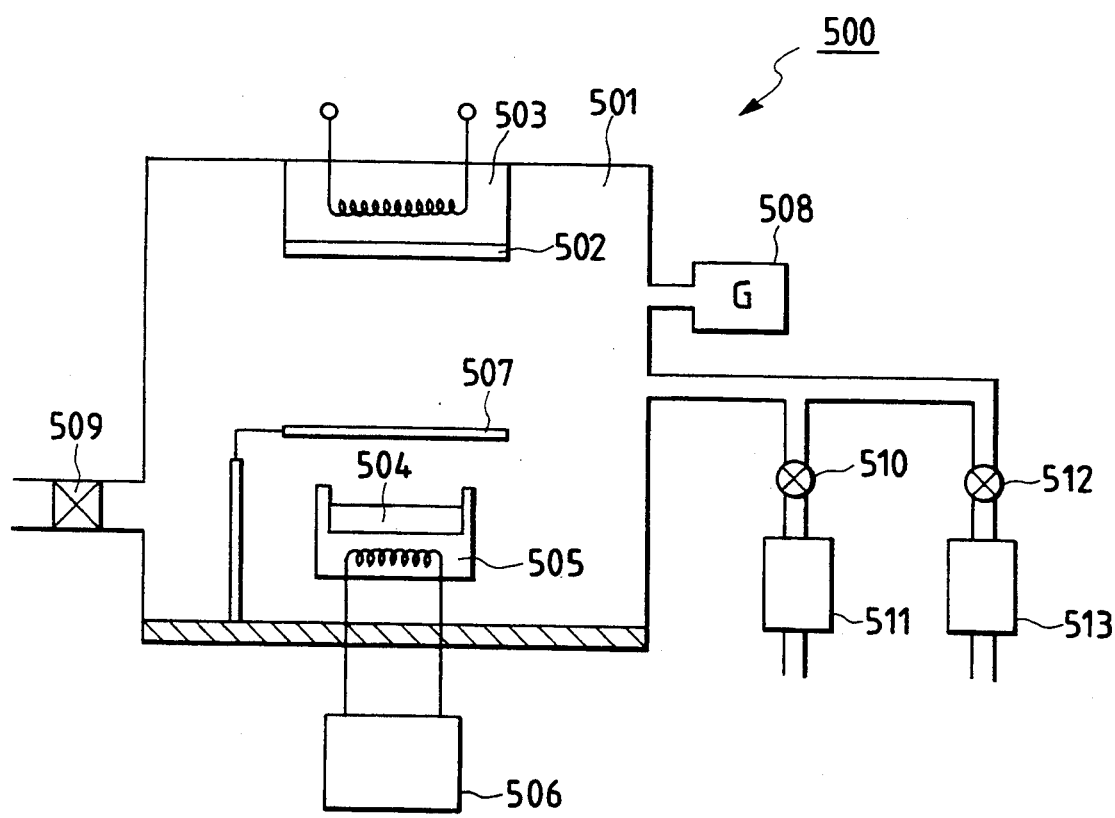
FIG. 5 is a schematic view which illustrates an example of an apparatus for manufacturing the transparent electrode for the photovoltaic device according to the present invention, wherein a manufacturing apparatus adapted to perform a vacuum evaporation method is illustrated.

A vacuum evaporation apparatus 500 is, as schematically shown in FIG. 5, composed of a deposition chamber 501, a substrate 502, a heater 503, an evaporation source 504, a conductance valve 509, gas introduction valves 510 and 512, mass flow controllers 511 and 513 or the like.

As a preferred evaporation source employed for depositing the transparent electrode containing carbon atoms or nitrogen atoms, a material prepared by adding carbon atoms or nitrogen atoms to metallic tin, metallic indium or the indium-tin alloy is exemplified. It is preferable that the maximum content of carbon atoms or nitrogen atoms contained in the evaporation source be 1000 ppm or less.

It is preferable that the temperature of the substrate during deposition of the transparent electrode containing carbon atoms or nitrogen atoms, according to the present invention, be in the range from 25° C. to 600° C.

In the case where the transparent electrode containing carbon atoms or nitrogen atoms is deposited, it is preferable to introduce the oxygen ($O_2$) gas at a pressure of $5 \times 10^{-5}$ Torr to $9 \times 10^{-4}$ Torr after the pressure in the deposition chamber has been lowered to a level of $10^{-6}$ Torr or lower.

By introducing oxygen in the aforementioned range, the above-mentioned metal gasified from the evaporation source reacts with oxygen in the gas phase so that an excellent transparent electrode can be deposited.

In the case where the transparent electrode containing carbon atoms or nitrogen atoms is deposited by the reactive evaporation, the transparent electrode may be deposited by evaporating the evaporation source and/or the other evaporation source which does not contain the carbon atoms or nitrogen atoms, in a state where the gas containing carbon atoms or nitrogen atoms has been introduced into the deposition chamber at a pressure lower than $5 \times 10^{-4}$ Torr. In addition, a process may be employed in which RF electric power is introduced at the aforementioned degree of vacuum to generate plasma and the evaporation is performed via the plasma thus generated. By changing, with time, the quantity of the gas containing carbon atoms or nitrogen atoms to be introduced into the deposition chamber, the distribution of the carbon atoms or nitrogen atoms contained in the transparent electrode can be arbitrarily changed. Also by changing the speed at which the evaporation source is evaporated while making the quantity of the gas containing carbon atoms or nitrogen atoms introduced into the deposition chamber a constant, the distribution of the carbon atoms or nitrogen atoms contained in the transparent electrode can be arbitrarily changed.

It is preferable to make the speed at which the transparent electrode is deposited under the aforementioned conditions be 0.01 to 10 nm/sec. If the deposition speed is lower the 0.01 nm/sec, the manufacturing yield will deteriorate. If it is higher than 10 nm/sec, a rough film is undesirably formed, causing the transmissivity, the conductivity, and the adhesion to deteriorate.

The preferred thickness of the transparent electrode which contains carbon atoms or nitrogen atoms is such that the conditions required for an anti-reflection film can be met. Specifically, it is preferable that the thickness of the transparent electrode range from 50 nm to 300 nm.

By causing carbon atoms to be simultaneously contained by the transparent electrode which contains nitrogen atoms, the characteristics of the photovoltaic device can be further improved.

By causing nitrogen atoms and carbon atoms to be simultaneously contained by the transparent electrode, the durability against the heat cycle to which the photovoltaic device according to the present invention is subjected can be further improved. In addition, the flexibility of the transparent electrode can be further improved, whereby cracking of the photovoltaic device is prevented.

It is preferable to make the quantities of carbon atoms and nitrogen atoms added to the transparent electrode of the photovoltaic device according to the present invention to be in the range of 100 ppm or less.

Such carbon atoms are introduced into the transparent electrode by the same means and method as those employed when nitrogen atoms are introduced.

By using a target or an evaporation source which contains carbon atoms for performing sputtering or vacuum evaporation for the purpose of depositing the transparent electrode, the transparent electrode may contain carbon atoms. It is preferable that a graphite-form carbon or diamond-form carbon be used as the carbon source material contained by the target and the evaporation source.

In the case where the transparent electrode containing nitrogen atoms and carbon atoms is deposited by the reactive sputtering method, the following process may be employed: the aforementioned target and/or the target which does not contain carbon atoms are combined so that the sputtering target is obtained, the raw material gas containing carbon atoms is, in addition to the aforementioned raw material gas containing nitrogen atoms, introduced into the deposition chamber, and plasma energy is utilized, so that carbon atoms may be introduced into the transparent electrode along with nitrogen atoms.

The raw material gas containing carbon atoms usable for the reactive sputtering may be made of a material exemplified by $CH_4$, $CD_4$, $C_nH_{2n+2}$ (n is an integer), $C_nH_{2n}$ (n is integer), $C_2H_2$, $C_6H_6$, $CO_2$, $CO$, or the like.

In the case where the transparent electrode containing carbon atoms and nitrogen atoms is deposited by the reactive evaporation, the evaporation source and/or the evaporation source which does not contain carbon atoms are evaporated in a state where the gas containing carbon atoms has been introduced into the deposition chamber to a pressure level of $5 \times 10^{-4}$ Torr or less. Furthermore, a process may be employed in which RF electric power is introduced at the aforementioned degree of vacuum so as to generate plasma, and the evaporation may be performed via the plasma thus generated.

p-type layer or n-type layer

The p- or n-type layer of the photovoltaic device according to the present invention is an important layer which influences the characteristics of the photovoltaic device.

The amorphous material (hereinafter expressed as "a-") and the fine crystal material (hereinafter expressed as "μc-") of the p- or the n-type layer of the photovoltaic device according to the present invention are exemplified by: material prepared by adding, at a high density, a p-type valence controlling agent (B, Al, Ga, In, or Tl of group IIIA of the periodic table) or an n-type valence controlling agent (P, As, Sb, or Bi of group VA of the periodic table) to a-Si:H, a-Si:HX, a-SiC:H, a-SiC:HX, a-SiGe:H, a-SiGeC:H, a-SiO:H, a-SiN:H, a-SiON:HX, a-SiOCN:HX, μc-Si:H, μc-SiC:H, μc-Si:HX, μc-SiC:HX, μc-SiGe:H, μc-SiO:H, μc-SiGe:H, SiN:H, μc-SiON:HX, μc-SiOCN:HX, or the like. The polycrystal material (hereinafter expressed as "poly-") is exemplified by a material prepared by adding, at a high density, a p-type valance controlling agent (B, Al, Ga, In, or Tl of group IIIA of the periodic table) or an n-type valence controlling agent (P, As, Sb, or Bi of group VA of the periodic table) to poly-Si:H, poly-Si:HX, poly-SiC:H, poly-SiC:HX, poly-SiGe:H, poly-Si, poly-SiC, poly-SiGe, or the like.

In particular, it is preferable that the p-type layer or the n-type layer on which light is incident be made of a crystalline semiconductor layer with small light absorption or an amorphous semiconductor layer having a wide band gap.

It is preferable that the addition of any one of the atoms of group IIIA of the periodic table to the p-type layer and of any one of the atoms of group VA of the periodic table to the n-type layer be in the range of 0.1 to 50 atom %.

Hydrogen atoms (H, D) or halogen atoms (X) contained by the p-type layer or the n-type layer act to compensate the non-bonded atoms of the p- or n-type layer, improving the doping efficiency of the p- or n-type layer. The optimum quantity of hydrogen atoms to be added to the p- or n-type layer is 0.1 to 40 atom %. In particular, in the case where the p- or the n-type layer is crystalline, the optimum quantity of hydrogen atoms or halogen atoms is in the range of 0.1 to 8 atom %. Furthermore, it is preferable that the hydrogen atoms and/or halogen atoms be distributed in a portion adjacent to the boundary between the p-type layer and the i-type layer and between the n-type layer and the i-type layer. In addition, it is preferable that the hydrogen atoms and/or halogen atoms distributed adjacent to the aforementioned boundaries be in the range from 1.1 to 2 times the quantity of the same in the bulk. By causing hydrogen atoms or halogen atoms to be contained in a larger quantity in the portion adjacent to the boundaries between the p-type layer and the i-type layer and between the n-type layer and the i-type layer, defect levels or mechanical distortions which may take place adjacent to the aforementioned boundaries can be reduced. Therefore, the photovoltaic force and the photoelectric current of the photovoltaic device according to the present invention can be increased.

In addition, it is preferable that a large quantity of hydrogen atoms and/or halogen atoms be distributed adjacent the boundary between the transparent electrode and the p-type layer or between the transparent electrode and the n-type layer. In addition, it is preferable that the hydrogen atoms and/or halogen atoms distributed adjacent to the aforementioned boundaries be in the range from 1.1 to 2 times the quantity of the same in the bulk. By causing hydrogen atoms or halogen atoms to be contained in a larger quantity in the portion adjacent to the boundaries between the transparent electrode and the p-type layer or between the transparent electrode and the n-type layer, defect levels or mechanical distortions which may take place adjacent to the aforementioned boundaries can be reduced. Therefore, the photovoltaic force and the optical electric current of the photovoltaic device according to the present invention can be increased.

It is preferable that the activation energy of the p- or n-type layer of the photovoltaic device according to the present invention be 0.2 eV or less, more preferably 0.1 eV or less. Furthermore, it is preferable that the specific resistance be 100 $\Omega$cm or less, more preferably 1 $\Omega$cm or less. In addition, it is preferable that the thickness of each of the p-type and the n-type layers be 1 to 50 nm, more preferably 3 to 10 nm.

As the raw material gas suitable for depositing the p-type or n-type layer of the photovoltaic device according the present invention, a compound which contains silicon atoms and can be gasified, a compound which contains germanium atoms and can be gasified, a compound which contains nitrogen atoms and can be gasified, and a gas mixture of the aforementioned compounds may be used.

Specifically, the compound which contains silicon atoms and can be gasified is exemplified by $SiH_4$, $SiH_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, $Si_2D_3H_3$, or the like.

The compound which contains germanium atoms and can be gasified is exemplified by $GeH_4$, $GeD_4$, $GeF_4$, $GeFH_3$, $GeF_2H_2$, $GeF_3H$, $GeHD_3$, $GeH_2D_2$, $GeH_3D$, $GeH_6$, $GeD_6$, or the like.

The compound which contains carbon atoms and can be gasified is exemplified by $CH_4$, $CD_4$, $C_nH_{2n+2}$ (n is an integer), $C_nH_{2n}$ (n is an integer), $C_2H_2$, $C_6H_6$, $CO_2$, CO, or the like.

The gas containing nitrogen is exemplified by $N_2$, $NH_3$, $ND_3$, NO, $NO_2$, $N_2O$, or the like.

The gas containing oxygen is exemplified by $O_2$, CO, $CO_2$, NO, $NO_2$, $N_2O$, $CH_3CH_2OH$, $CH_3OH$, or the like.

The material to be introduced into the p-type or n-type layer for the purpose of controlling the valence electrons is exemplified by atoms of group IIIA or VA of the periodic table.

As an effective starting material for introducing the boron atoms of group IIIA, a boron hydride such as $B_2H_6$, $B_4H_{10}$, $B_5H_9$, $B_5H_{11}$, $B_6H_{10}$, $B_6H_{12}$, $B_6H_{14}$, or the like, and halogen hydrides such as $BF_3$, $BCl_3$, or the like are exemplified. Also, $AlCl_3$, $GaCl_3$, $INC_3$, $TlCl_3$, or the like are exemplified. In particular, $B_2H_6$ and $BF_3$ are suitable for use.

As an effective starting material for introducing the phosphorus atoms of group VA, a phosphorus hydride such as $PH_3$, $P_2H_4$, or the like and a phosphorus halogenide such as $PH_4I$, $PF_3$, $PF_5$, $PCl_3$, $PCl_5$, $PBr_3$, $PBr_5$, $PI_3$, or the like are exemplified. Also $ASH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$, or the like are exemplified. In particular, $PH_3$ and $PF_3$ are suitable for use.

The p- or n-type layer of the photovoltaic device according to the present invention can be preferably deposited by an RF plasma CVD method or a $\mu$W plasma CVD method.

In the case where the RF plasma CVD method is employed to deposit the aforementioned layer, a capacitance coupled type RF plasma CVD method is suitable for use.

In the case where the p- or n-type layer is deposited by the RF plasma CVD method, the optimum conditions are as follows: the temperature of the substrate in the deposition chamber is 100° to 350° C., the internal pressure is 0.1 to 10 Torr, the RF power is 0.05 to 1.0 W/cm$^2$ and the deposition speed is 0.01 to 3 nm/sec.

The compound which can be gasified may be diluted with $H_2$, He, Ne, Ar, Xe, Kr gas, or the like before it is introduced into the deposition chamber.

In the case where the layer is made of a fine crystal semiconductor which does not absorb light considerably or a layer having a wide band gap is deposited, it is preferable to dilute the raw material with a hydrogen gas 2 to 100 times and to introduce relatively large RF power. The preferred RF frequency is 1 MHz to 100 MHz, more preferably, a frequency near 13.56 MHz.

In the case where the p- or n-type layer suitable for the present invention is deposited by the $\mu$W plasma CVD method, it is preferable to constitute the $\mu$W plasma CVD apparatus in such a manner that microwaves are introduced into the deposition chamber through a wave guide pipe via a dielectric window (made of alumina ceramics or the like).

In the case where the p- or n-type layer suitable for the present invention is deposited by the $\mu$W plasma CVD method, it is preferable that the temperature of the substrate in the deposition chamber be 100° to 400° C., the internal pressure be 0.5 to 30 mTorr, the $\mu$W power be 0.01 to 1 W/cm$^3$, and the frequency of $\mu$W be 0.5 to 10 GHz.

Furthermore, the aforementioned compound which can be gasified may be diluted with $H_2$, He, Ne, Ar, Xe, Kr gas, or the like before it is introduced into the deposition chamber.

In particular, in the case where a fine crystal semiconductor, or a layer such as a-SiC:H which does not considerably absorb light, or a layer which has a wide band gap is deposited, it is preferable that the raw material gas be diluted with a hydrogen gas 2 to 100 times and a relatively large $\mu W$ power be introduced.

i-type layer

The i-type layer of the photovoltaic device according to the present invention is an important layer for generating and transporting charge carriers when it is irradiated with light.

As the i-type layer of the photovoltaic device according to the present invention, a slightly p-type layer or a slightly n-type layer may be used. In the case where a semiconductor layer is used in which the product of the mobility and lifetime of the positive holes is smaller than the product of the mobility and lifetime of the electrons is used, it is suitable to employ a slightly p-type layer. In the case where a semiconductor layer is used in which the product of the mobility and lifetime of the electrons is smaller than the product of the mobility and lifetime of the positive holes, it is suitable to employ a slightly n-type layer.

The material for the i-type layer of the photovoltaic device according to the present invention is exemplified by an amorphous (hereinafter expressed as "a-") material such as a-Si:H, a-Si:HX, a-SiC:H, a-SiC:HX, a-SiGe:H, a-SiGe:HX, a-SiGeC:HX, or the like.

In particular, it is preferable to use a material caused to be intrinsic type by adding, as a valence controlling agent, atoms of group IIIA and/or atoms of group VA of the periodic table to the aforementioned amorphous material.

Hydrogen atoms (H, D) or halogen atoms (X) contained by the i-type layer act to compensate the non-bonded atoms of the i-type layer so as to cause the i-type layer to have an improved product of the mobility of the carrier and its lifetime. It further acts to compensate the level of the boundaries between the p-type layer and the i-type layer and between the n-type layer and the i-type layer, improving the photovoltaic force, the photoelectric current, and the light responsiveness of the photovoltaic device. It is preferable that hydrogen atoms and/or halogen atoms be contained by the i-type layer in an amount from 1 to 40 atom %. In particular, it is preferable that hydrogen atoms and/or halogen atoms be distributed in a larger quantity adjacent to the boundaries between the p-type layer and the i-type layer and between the n-type layer and the i-type layer. Furthermore, it is preferable to make the contents of hydrogen atoms and halogen atoms adjacent to the boundaries to be 1.1 to 2 times the contents in the bulk.

It is preferable that the thickness of the i-type layer be 0.1 to 1.0 $\mu m$ although it depends considerably on the structure (for example, a single cell, a tandem cell or a triple cell) of the photovoltaic device and the band gap of the i-type layer.

It is preferable that the physical properties of the i-type layer be as follows: the mobility of electrons is 0.01 $cm^2/V/sec$ or more, the mobility of the positive holes is 0.0001 $cm^2/V/sec$ or more, the band gap is 1.1 to 2.2 eV, the local state density at the center of the forbidden zone is $10^{18}$ $cm^3/eV$ or less, and the inclination of the Urbach tail adjacent to the valence zone is 65 meV or less. Furthermore, it is preferable that the current-voltage characteristics of the photovoltaic device according to the present invention are measured under AM 1.5, 100 $mW/cm^2$, the curve fitting is performed by the Hecht method, and the product of the mobility and the lifetime obtained from the curve fitting is $10^{-10}$ $cm^2/V$ or more.

It is preferable that the band gap of the i-type layer be widened adjacent to the boundaries between the p-type layer and the i-type layer and between the n-type layer and the i-type layer. In this case, the photovoltaic force and the photoelectric current of the photovoltaic device can be increased and deterioration due to light irradiation after the photovoltaic device is used for a long time can be prevented.

A raw material gas suitable to deposit the i-type layer of the photovoltaic device according to the present invention is exemplified by a compound which contains silicon atoms and can be gasified, a compound which contains germanium atoms and can be gasified, a compound which contains carbon atoms and can be gasified, a compound which contains nitrogen atoms and can be gasified, and a gaseous mixture of the aforementioned compounds.

Specifically, the compound which contains silicon atoms and can be gasified is exemplified by $SiH_4$, $SiH_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, $Si_2D_3H_3$, or the like.

The compound which contains germanium atoms and can be gasified is exemplified by $GeH_4$, $GeD_4$, $GeF_4$, $GeFH_3$, $GeF_2H_2$, $GeF_3H$, $GeHD_3$, $GeH_2D_2$, $GeH_3D$, $GeH_6$, $GeD_6$, or the like.

The compound which contains carbon atoms and can be gasified is exemplified by $CH_4$, $CD_4$, $C_nH_{2n+2}$ (n is an integer), $C_nH_{2n}$ (n is an integer), $C_2H_2$, $C_6H_6$, or the like.

The material to be introduced into the i-type layer for the purpose of controlling the valence electrons of the i-type layer is exemplified by atoms of group IIIA and those of group VA of the periodic table.

An effective starting material according to the present invention for introducing atoms of group IIIA is exemplified by a boron hydride such as $B_2H_6$, $B_4H_{10}$, $B_5H_9$, $B_5H_{11}$, $B_6H_{10}$, $B_6H_{12}$, $B_6H_{14}$, or the like and halogen hydrides such as $BF_3$, $BCl_3$, or the like. Also $AlCl_3$, $GaCl_3$, $INCl_3$, $TlCl_3$, or the like are exemplified.

As an effective starting material for introducing the phosphorous atoms of group VA, a phosphorous hydride such as $PH_3$, $P_2H_4$, or the like and a phosphorous halogenide such as $PH_4I$, $PF_3$, $PF_5$, $PCl_3$, $PCl_5$, $PBr_3$, $PBr_5$, $PI_3$, or the like are exemplified. Also $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$, or the like are exemplified.

It is preferable that the quantity of atoms of groups IIIA and VA of the periodic table introduced into the i-type layer for the purpose of controlling the conductivity be 1000 ppm or less.

The preferred methods for depositing the i-type layer adaptable to the present invention are exemplified by the RF plasma CVD method and the $\mu W$ plasma CVD method. When the RF plasma CVD method is employed, it is preferable to use a capacitance coupled type RF plasma CVD apparatus.

When the i-type layer is deposited by the RF plasma CVD method, the optimum conditions are as follows: the temperature of the substrate in the deposition chamber is 100° to 350° C. the internal pressure is 0.1 to 10

Torr, the RF power is 0.05 to 10 W/cm$^2$, and the deposition speed is 0.01 to 3 nm/sec.

Furthermore, the compound which can be gasified may be arbitrarily diluted with $H_2$, He, Ne, Ar, Xe, Kr gas, or the like before it is introduced into the deposition chamber.

When a layer such as a-SiC:H having a wide band gap is deposited, it is preferable that the raw material gas be diluted with hydrogen gas 2 to 100 times and a relatively large RF power be introduced. The preferred RF frequency is 1 MHz to 100 MHz, more preferably 13.56 MHz.

When the i-type layer according to the present invention is deposited by the $\mu$W plasma CVD method, it is preferable to introduce microwaves into the deposition chamber through a wave-guide pipe via a dielectric window (made of alumina ceramics or the like).

When the i-type layer according to the present invention is deposited by the $\mu$W plasma CVD method, it is preferable that the temperature of the substrate in the deposition chamber be 100° to 400° C., the internal pressure be 0.5 to 30 mTorr, the $\mu$W power be 0.01 to 1 W/cm$^3$, and the $\mu$W frequency be 0.5 to 10 GHz.

Furthermore, the compound which can be gasified may be arbitrarily diluted with $H_2$, He, Ne, Ar, Xe, Kr gas, or the like before it is introduced into the deposition chamber.

When a layer such as a-SiC:H having a wide band gap is deposited, it is preferable that the raw material gas be diluted with hydrogen gas 2 to 100 times and a relatively large RF power be introduced.

Conductive Substrate

The conductive substrate may be made of conductive material, or a supporting member may be formed of an insulating material or a conductive material and processed to have conductivity. The material for the conductive supporting member is exemplified by metal such as NiCr, stainless steel, Al, Cr, Mo, Au, Nb, Ta, V, Ti, Pt, Pb, Sn, or the like, and their alloys.

The electrically insulating supporting member may be made of a synthetic resin film or a sheet, the material of which is exemplified by polyester, polyethylene, polycarbonate, cellulose acetate, polypropylene, polyvinyl chloride, polyvinylidene, polystyrene, polyamide and the like, glass, ceramics, paper, and the like. It is preferable that the electrically insulating supporting member be manufactured in such a manner that the surface of at least one side is subjected to a process for providing conductivity and the photovoltaic layer is formed on the surface of the aforementioned side.

In the case where glass is employed, a thin film made of NiCr, Al, Cr, Mo, Ir, Nb, Ta, V, Ti, Pt, Pb, $In_2O_3$, ITO ($In_2O_3$+Sn), or the like is formed on the surface of the glass so as to provide conductivity. In the case where a synthetic resin film made of polyester film or the like is employed, a metal thin film made of NiCr, Al, Ag, Pb, Zn, Ni, Au, Cr, Mo, Ir, Nb, Ta, V, Tl, Pt, or the like is formed on the surface of the synthetic resin film by vacuum evaporation, electron beam evaporation, sputtering, or the like. As an alternative to this, the aforementioned surface is laminated with the aforementioned metal before it has conductivity. The supporting member may be formed into a sheet having a flat and smooth surface or a wavy surface. Although its thickness is determined so as to form a desired photovoltaic device, it may be thinned as long as the function of the supporting member can be exhibited in a case where the photovoltaic device requires flexibility. However, the thickness usually must be 10 $\mu$m or more so as to be easily manufactured and handled and to have satisfactory mechanical strength.

Example 1

A photovoltaic device according to the present invention was manufactured by a DC magnetron sputtering method and a microwave (hereinafter abbreviated to "$\mu$W") glow discharge decomposition method.

First, a transparent electrode, which contains carbon atoms, was formed on a substrate by the DC magnetron sputtering apparatus 300 shown in FIG. 3.

Referring to FIG. 3, reference numeral 302 represents the substrate made barium borosilicate glass ("7059" manufactured by Corning K.K.) formed into a 50 mm ×50 mm square and having a thickness of 1 mm.

In FIG. 3, reference numeral 304 represents a target composed of indium (In), tin (Sn) and carbon (C) contained in a molar ratio of 85:15:0.005, the target 304 being insulated from the deposition chamber 301 by an insulating supporting member 305.

Referring to FIG. 3, reference numeral 308 represents a target composed of indium (In) and tin (Sn) contained in a molar ratio of 85:15, the target 308 being insulated from the deposition chamber 301 by an insulating supporting member 309.

Referring to FIG. 3, reference numerals 314 and 315 represent gas introduction valves, each of which is connected to an oxygen ($O_2$) and an argon (Ar) gas cylinder (not shown).

First, the substrate 302 was heated to 350° C. by a heater 303 and the inside of the deposition chamber 301 was exhausted by a vacuum pump (not shown) until a vacuum gauge 312 indicated a pressure of about $1 \times 10^{-5}$ Torr. At this time, the gas introduction valves 314 and 315 were gradually opened to introduce the $O_2$ gas and the Ar gas into the deposition chamber 301. In order to set the flow rate of the $O_2$ gas at 20 sccm and the Ar gas at 20 sccm at this time, corresponding mass-flow controllers 317 and 318 were used to control them. Furthermore, the opening of a (butterfly type) conductance valve 313 was adjusted while observing the vacuum gauge 312 so as to set the pressure in the deposition chamber 301 at 2 mTorr. Then, the voltage of a DC power source 306 was set at −400 V and DC power was supplied to the target 304, while the voltage of a DC power source 310 was set at −450 V and the DC power was supplied to the target 308, causing DC glow discharge to take place. Then, shutters 307 and 311 were opened so that the process of manufacturing the transparent electrode on the substrate was commenced. Simultaneously, the voltage of the DC power source 310 was gradually changed from −450 V to −350 V at a predetermined rate until a transparent electrode of 70 nm thickness was formed. At this time, the shutters 307 and 311 were closed, and the outputs from the DC power sources 306 and 310 were turned off so that the DC glow discharge was terminated. Then, the gas introduction valve 315 was closed to stop the introduction of the Ar gas into the deposition chamber 301. Furthermore, the opening of the conductance valve 313 was adjusted to make the internal pressure of the deposition chamber 1 Torr, and the transparent electrode was subjected to a heat treatment for one hour, whereby a transparent electrode containing carbon atoms was manufactured.

Figure 4:
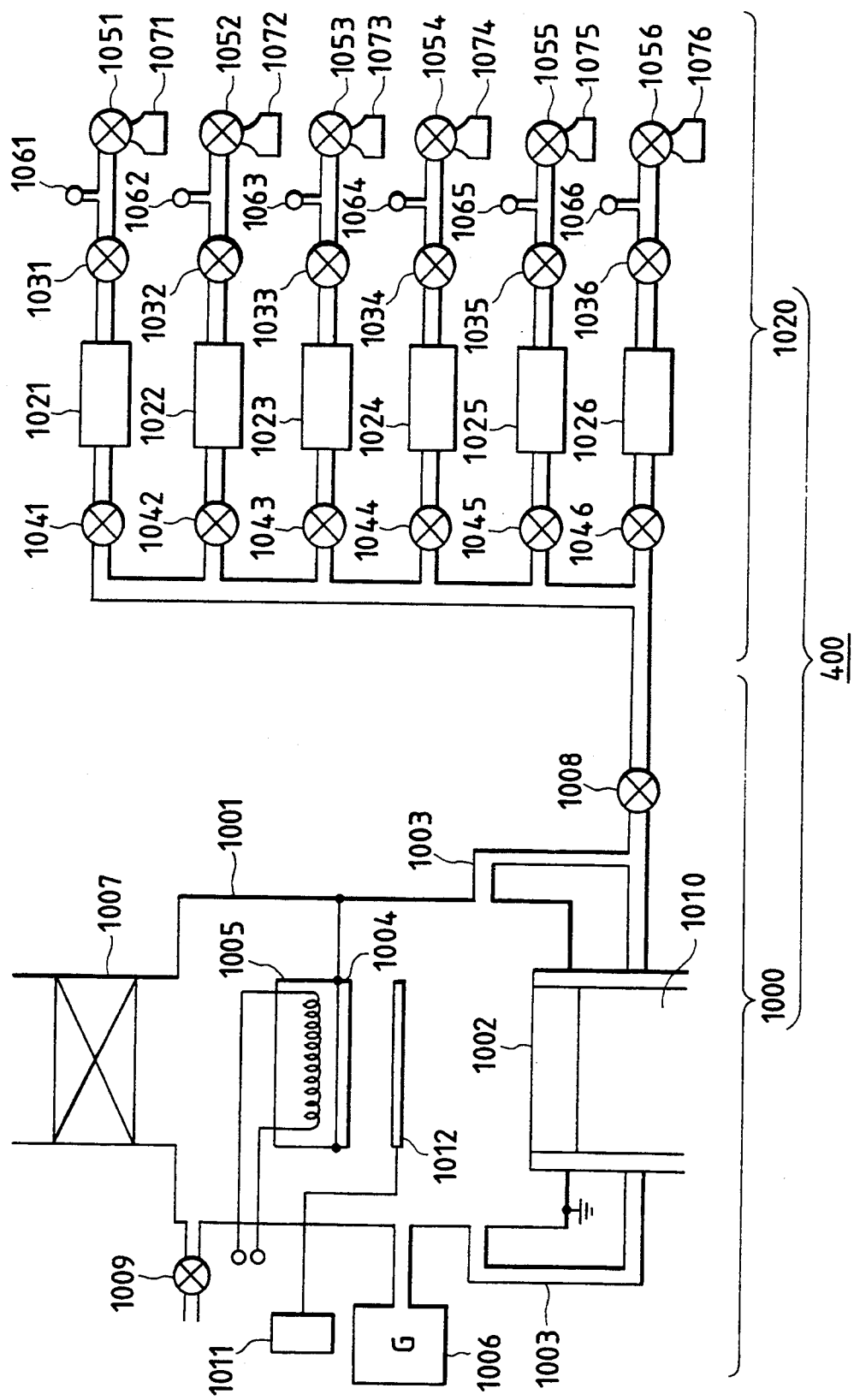
FIG. 4 is a schematic view which illustrates an example of an apparatus for manufacturing a non-single-crystal silicon semiconductor layer for the photovoltaic device according to the present invention, wherein a manufacturing apparatus adapted to perform a glow discharge method which uses $\mu W$ is illustrated.

Then, a manufacturing apparatus 400, composed of a raw material gas supply section 1020 and a deposition section 1000, as shown in FIG. 4 and adapted for performing the μW glow discharge decomposition method, was used to form a non-single-crystal silicon semiconductor layer on the transparent electrode.

Referring to FIG. 4, gas cylinders 1071 to 1076 are filled with raw material gases for manufacturing the non-single-crystal silicon semiconductor layers according to the present invention.

Reference numeral 1071 represents a $SiH_4$ (purity was 99.999%) gas cylinder, 1072 represents a $H_2$ (purity was 99.9999%) gas cylinder, 1073 represents a cylinder for $B_2H_6$ gas (purity was 99.99% and hereinafter abbreviated to "$B_2H_6/H_2$") diluted with $H_2$ gas to 10%, 1074 represents a cylinder for $PH_3$ gas (purity was 99.99% and hereinafter abbreviated to "$PH_3/H_2$") diluted with $H_2$ gas to 10%, 1075 represents a $CH_4$ (purity was 99.9999%) gas cylinder, and 1076 represents a $GeH_4$ (purity was 99.99%) gas cylinder. When the cylinders 1071 to 1076 were installed, the aforementioned gases were introduced into the gas pipes via valves 1051 to 1056 to gas introduction valves 1031 and 1036.

Reference numeral 1004 represents a substrate on which the transparent electrode was formed by the aforementioned method.

First, the $SiH_4$ gas was introduced from the gas cylinder 1071, the $H_2$ gas was introduced from the gas cylinder 1072, the $B_2H_6/H_2$ gas was introduced from the gas cylinder 1073, the $PH_3/H_2$ gas was introduced from the gas cylinder 1074, the $CH_4$ gas was introduced from the gas cylinder 1075, and the $GeH_4$ gas was introduced from the gas cylinder 1076 by opening valves 1051 to 1056, and the pressure of each gas was set to about 2 $kg/cm^2$ by pressure adjusters 1061 to 1066.

Then, closures of introduction valves 1031 to 1036 and a leak valve 1009 of a deposition chamber 1001 were confirmed, as well as opening of discharge valves 1041 to 1046 and an auxiliary valve 1008 and then a (butterfly type) conductance valve 1007 was fully opened and the deposition chamber 1001 and the gas pipe were exhausted by a vacuum pump (not shown) until a vacuum gauge 1006 indicated a pressure of about $1 \times 10^{-4}$ Torr. At this time, the auxiliary valve 1008 and the discharge valves 1041 to 1046 were closed.

Then, the introduction valves 1031 to 1036 were gradually opened so that the aforementioned gases were introduced into corresponding mass-flow controllers 1021 to 1026.

After preparations for forming the layers were completed, the p-, the i-, and the n-type layers were formed on the substrate 1004.

The p-type layer was formed in such a manner that the substrate 1004 was heated by a heater 1005 to 350° C., and the discharge valves 1041 to 1043 were gradually opened so that the $SiH_4$ gas, the $H_2$ gas and the $B_2H_6/H_2$ gas were introduced into the deposition chamber 1001 via a gas introduction pipe 1003. At this time, the corresponding mass-flow controllers 1021 to 1023 were used to set the flow rate of the $SiH_4$ gas at 10 sccm, the $H_2$ gas at 100 sccm, and the $B_2H_6/H_2$ gas at 5 sccm. In order to set the internal pressure of the deposition chamber 1001 at 20 mTorr, the opening of the conductance valve 1007 was adjusted while observing the vacuum gauge 1006. Then, the output power of a μW power source (not shown) was set at 400 $mW/cm^3$ and it was supplied to the inside of the deposition chamber 1001 via a wave-guide pipe (not shown), a wave-guide portion 1010 and a dielectric window 1002. As a result, μW glow discharge was initiated, and the process of forming the p-type layer on the transparent electrode was conducted until a p-type layer which was 5 nm thick was formed. At this time, the μW glow discharge was stopped, and the discharge valves 1041 to 1043 and the auxiliary valve 1008 were closed to stop the introduction of the gases into the deposition chamber 1001. Thus, the process of forming the p-type layer was completed.

Then, the i-type layer was formed in such a manner that the substrate 1004 was heated to 350° C. by the heater 1005, and the discharge valves 1041 and 1042 and the auxiliary valve 1008 were gradually opened so that the $SiH_4$ gas and the $H_2$ gas were introduced into the deposition chamber 1001 via the gas introduction pipe 1003. At this time, the corresponding mass-flow controllers 1021 and 1022 were used to set the flow rate of the $SiH_4$ gas at 100 sccm and the $H_2$ gas at 200 sccm. In order to set the internal pressure of the deposition chamber 1001 at 5 mTorr, the opening of the conductance valve 1007 was adjusted while observing the vacuum gauge 1006. Then, a high frequency bias of 100 $mW/cm^3$ and a DC bias of 75 V with respect to the substrate 1004 were supplied from power source 1011 to a bias rod 1012. Then, the power output of the μW power source (not shown) was set to 100 $mW/cm^3$ and it was supplied to the inside of the deposition chamber 1001 via the wave-guide pipe (not shown), the wave-guide portion 1010, and the dielectric window 1002. As a result, μW glow discharge was caused to take place, and the process of forming the i-type layer on the p-type layer was conducted until an i-type layer which was 400 nm thick was formed. At this time, the μW glow discharge was stopped, and the output of the bias power source was stopped. Thus, the process of forming the i-type layer was completed.

The n-type layer was formed in such a manner that the substrate 1004 was heated to 300° C. by the heater 1005, and the discharge valves 1041, 1042, and 1044 were gradually opened so that the $SiH_4$ gas, the $H_2$ gas and the $PH_3/H_2$ gas were introduced into the deposition chamber 1001 via the gas introduction pipe 1003.

At this time, the corresponding mass-flow controllers 1021, 1022, and 1024 were used to set the flow rate of the $SiH_4$ gas at 30 sccm, the $H_2$ gas at 100 sccm and the $PH_3/H_2$ gas at 6 sccm. In order to set the internal pressure of the deposition chamber 1001 at 10 mTorr, the opening of the conductance valve 1007 was adjusted while observing the vacuum gauge 1006. Then, the output power of the μW power source (not shown) was set at 50 $mW/cm^3$ so as to be supplied to the inside of the deposition chamber 1001 via the wave-guide pipe (not shown), the wave-guide portion 1010, and the dielectric window 1002. As a result, μW glow discharge was initiated and the process of forming the n-type layer on the i-type layer was conducted until a n-type layer which was 10 nm thick was formed. At this time, the μW glow discharge was stopped, and the discharge valves 1041, 1042, 1044 and the auxiliary valve 1008 were closed to stop the introduction of the gases into the deposition chamber 1001. Thus, the process of forming the n-type layer was completed.

When each of the aforementioned layers is formed, the discharge valves 1041 to 1046 must, of course, be closed completely except for the valves for the required gases. Furthermore, undesirable retention of the gases in the deposition chamber 1001 and the pipes arranged from the discharge valves 1041 to 1046 to the deposition chamber 1001 is prevented by closing the discharge valves 1041 to 1046, by opening the auxiliary valve 1008, and by fully opening the conductance valve 1007 so as to temporarily exhaust the inside portion of the system to a high degree of vacuum if necessary.

Then, Al was vacuum-evaporated on the n-type layer to a thickness of 2 μm to serve as a backside electrode, whereby the photovoltaic device was manufactured (device No. Example 1).

The aforementioned conditions for manufacturing the photovoltaic device are shown in Tables 1-1 and 1-2.

TABLE 1-1

| Substrate | Barium borosilicate glass 50 mm × 50 mm thickness 1 mm | |
|---|---|---|
| Transparent Electrode | Conditions for manufacturing by DC magnetron sputtering | |
| | Flow rate of $O_2$ gas | 20 sccm |
| | Flow rate of Ar gas | 20 sccm |
| | Temperature of substrate | 350° C. |
| | Internal pressure | 2 mTorr |
| | Thickness of layer | 70 nm |
| | Composition of target (molar ratio) | DV voltage |
| | In   85 | −400 V |
| | Sn   15 | |
| | C    0.005 | |
| | In   85 | −450 V → −350 V |
| | Sn   15 | (changed at a predetermined rate |

TABLE 1-2

| | Conditions for manufacturing layers | | | | | |
|---|---|---|---|---|---|---|
| Name of layer | Gas and flow rate (sccm) | μW power (mW/cm$^3$) | Internal pressure (mTorr) | Temperature of substrate (°C.) | Bias | Thickness of layer (nm) |
| p-type layer | SiH$_4$   10<br>H$_2$   100<br>B$_2$H$_6$/H$_2$   5<br>(diluted to 10%) | 400 | 20 | 350 | Excluded | 5 |
| i-type layer | SiH$_4$   100<br>H$_2$   200 | 100 | 5 | 350 | RF 100 mW/cm$^3$ DC 75 V | 400 |
| n-type layer | SiH$_4$   30<br>H$_2$   100<br>PH$_3$/H$_2$   6<br>(diluted to 10%) | 50 | 10 | 300 | Excluded | 10 |
| Backside Electrode | Al   2 μm | | | | | |

Comparative Example 1

A conventional photovoltaic device was manufactured by a method similar to that according to Example 1.

First, a transparent electrode was formed on a substrate by the manufacturing apparatus 300 as shown in FIG. 3 and adapted to perform the DC magnetron sputtering method.

Similarly to Example 1, the substrate was heated to 350° C., and the $O_2$ gas and the argon gas were each introduced into the deposition chamber 301 at 20 sccm. Then, the internal pressure of the deposition chamber 301 was set at 2 mTorr. Then, the voltage of the DC power source 310 was set at −400 V and the DC power was supplied to the target 308 so that DC glow discharge was generated. Then, the shutter 311 was opened so that the process of manufacturing the transparent electrode on the substrate 302 was commenced. A transparent electrode having a thickness of 70 nm was deposited, the shutter 311 was closed and the DC power source 310 was turned off to stop the DC glow discharge. Then, the gas introduction valve 315 was closed to stop the introduction of the Ar gas into the deposition chamber 301, and the opening of the conductance valve 313 was adjusted to set the internal pressure of the deposition chamber 301 at 1 Torr. Then, the transparent electrode was subjected to a heat treatment for one hour, and thus the transparent electrode was manufactured.

Then, the p-, i-, and n-type layers and the backside electrode were formed on the transparent electrode under the same conditions as those according to Example 1, whereby a photovoltaic device was manufactured (device No. Comparative Example 1).

The initial characteristics and the durability of the photovoltaic devices according to Example 1 (device No. Example 1) and Comparative Example 1 (device No. Comparative Example 1) were measured.

The initial characteristics were measured in such a manner that short-circuit currents and series resistances were measured by measuring the V-I characteristics while irradiating the photovoltaic devices according to Example 1 (device No. Example 1) and Comparative Example 1 (device No. Comparative Example 1) with AM-1.5 light (100 mW/cm$^2$). As a result, the photovoltaic device according to Example 1 (device No. Example 1) exhibited an excellent short-circuit current 1.04 times that of the photovoltaic device according to Comparative Example 1 (device No. Comparative Example 1) and an excellent series resistance 1.37 times the same.

The durability was measured in such a manner that the changes in the photoelectric conversion efficiencies were evaluated after performing the following process: the photovoltaic devices according to Example 1 (device No. Example 1) and Comparative Example 1 (device No. Comparative Example 1) were allowed to stand in the dark in an atmosphere the humidity of which was 85% and subjected 30 times to heat cycles each consisting of standing at a temperature of 85° C. for four hours and at a temperature of −40° C. for 30 minutes. As a result, the photovoltaic device according to Example 1 (device No. Example 1) exhibited an excellent photoelectric conversion efficiency 1.09 times that of the photovoltaic device according to Comparative Example 1 (device No. Comparative Example 1).

Furthermore, the distribution of the carbon atoms in the transparent electrode according to Example 1 (device No. Example 1) was analyzed by using a secondary ionization mass analyzer ("IMS-3F" manufactured by CAMECA), which indicated that the quantity of carbon atoms was considerably reduced from the portion adjacent to the p-type layer toward the substrate.

As a result, it was confirmed that the photovoltaic device (device No. Example 1) according to the present invention which used the transparent electrode containing carbon atoms has excellent characteristics in comparison with the conventional photovoltaic device (device No. Comparative Example 1) and therefore the beneficial effect of the present invention was confirmed.

Example 2

The transparent electrode, the p-, i-, and n-type layers and the backside electrode were formed under conditions similar to those for manufacturing the photovoltaic device according to Example 1 except that the alloys shown in Table 2 were used as the material of the target 304 whereby several photovoltaic devices were manufactured (device No. Examples 2-1 to 2-5).

The initial characteristics and the durability characteristics of the photovoltaic devices (device No. Examples 2-1 to 2-5), thus manufactured, were measured by a method similar to that according to Example 1. The results are shown in Table 2.

TABLE 2

| Device No. | Composition of target (mole ratio) | Short-circuit current | Series resistance | Durability characteristic |
|---|---|---|---|---|
| Example 2-1 | In:Sn:C = 85:15:0.01 | 1.05 | 1.31 | 1.07 |
| Example 2-2 | In:C = 100:0.001 | 1.05 | 1.30 | 1.07 |
| Example 2-3 | Sn:C = 100:0.005 | 1.05 | 1.29 | 1.06 |
| Example 2-4 | In:Sn:C = 80:20:0.007 | 1.06 | 1.37 | 1.06 |
| Example 2-5 | In:Sn:C = 90:10:0.003 | 1.05 | 1.33 | 1.07 |

*results of measurements were relative values with respect to Comparative Example 1 (device No. Comparative Example 1)

Thus, it was confirmed that the photovoltaic devices (device No. Examples 2-1 to 2-5) using the transparent electrode containing carbon atoms according to the present invention have excellent characteristics in comparison with the conventional photovoltaic device (device No. Comparative Example 1) and therefore an advantageous effect of the present invention was confirmed.

Example 3

The transparent electrode, the p-, i-, and n-type layers and the backside electrode were formed under conditions similar to those for manufacturing the photovoltaic device according to Example 1. Specific conditions for the formation of the n-, i-, and p-type layers are shown in Table 3, whereby another photovoltaic device was manufactured (device No. Example 3).

TABLE 3

| | Conditions for manufacturing layers | | | | |
|---|---|---|---|---|---|
| Name of layer | Gas and flow rate (sccm) | $\mu$W power (mW/cm$^3$) | Internal pressure (mTorr) | Temperature of substrate (°C.) | Bias | Thickness of layer (nm) |
| n-type layer | SiH$_4$ 10<br>H$_2$ 100<br>PH$_3$/H$_2$ 8<br>(diluted to 10%) | 350 | 15 | 350 | Excluded | 5 |
| i-type layer | SiH$_4$ 100<br>H$_2$ 200 | 100 | 5 | 350 | RF 100 mW/cm$^3$<br>DC 75 V | 400 |
| p-type layer | SiH$_4$ 30<br>H$_2$ 100<br>B$_2$H$_6$/H$_2$ 3<br>(diluted to 10%) | 50 | 10 | 300 | Excluded | 15 |

Comparative Example 2

The transparent electrode, the n-, i-, and p-type layers and the backside electrode were formed under conditions similar to those for manufacturing the photovoltaic device according to Example 1 except the transparent electrode was formed on the substrate under the same manufacturing conditions according to Comparative Example 1, whereby another comparative photovoltaic device was manufactured (device No. Comparative Example 2).

The initial characteristics and the durability characteristics of the photovoltaic device according to Example 3 (device No. Example 3) and Comparative Example 2 (device No. Comparative Example 2) were measured by a method similar to that according to Example 1. As a result, the photovoltaic device according to Example 3 (device No. Example 3) exhibited a 1.05 times greater short-circuit current, an excellent series resistance 1.32 times greater, and an excellent durability characteristic 1.09 times that of the photovoltaic device according to Comparative Example 2 (device No. Comparative Example 2). Therefore, it was confirmed that the photovoltaic device (device No. Example 3) using the transparent electrode containing carbon atoms according to the present invention has excellent characteristics in comparison with those of the conventional photovoltaic device (device No. Comparative Example 2), and therefore a beneficial effect of the present invention was confirmed.

Example 4

The transparent electrode containing carbon atoms was formed on the substrate under the manufacturing conditions according to Example 1, and p-, i-, n-, p-, i-, and n-type layers were sequentially formed on the aforementioned transparent electrode by using CH$_4$ gas and GeH$_4$ gas under the manufacturing conditions shown in Tables 4-1 and 4-2. Then, a ZnO thin film of 1 $\mu$m thickness was evaporated on the n-type layer by the DC magnetron sputtering method to serve as a reflection enhancing layer. Furthermore, a silver thin film of 300 nm thickness was deposited thereon by the DC magnetron sputtering method to serve as a light reflective layer, and then the backside electrode was formed on the silver thin film, whereby yet another photovoltaic device was manufactured (device No. Example 4).

conventional photovoltaic device (device No. Comparative Example 3), and therefore a desirable effect of the present invention was confirmed.

Example 5

A photovoltaic device according to the present in-

TABLE 4-1

| Name of layer | Gas and flow rate (sccm) | | $\mu$W power (mW/cm$^3$) | Internal pressure (mTorr) | Temperature of substrate (°C.) | Bias | Thickness of layer (nm) |
|---|---|---|---|---|---|---|---|
| p-type layer | SiH$_4$<br>CH$_4$<br>H$_2$<br>B$_2$H$_6$/H$_2$<br>(diluted to 10%) | 10<br>2<br>400<br>10 | 500 | 20 | 350 | RF<br>60 mW/cm$^3$<br>DC 90 V | 5 |
| i-type layer | SiH$_4$<br>H$_2$ | 100<br>200 | 50 | 3 | 350 | RF<br>120 mW/cm$^3$<br>DC 80 V | 200 |
| n-type layer | SiH$_4$<br>H$_2$<br>PH$_3$/H$_2$<br>(diluted to 10%) | 15<br>100<br>5 | 50 | 15 | 300 | Excluded | 5 |

TABLE 4-2

| Name of layer | Gas and flow rate (sccm) | | $\mu$W power (mW/cm$^3$) | Internal pressure (mTorr) | Temperature of substrate (°C.) | Bias | Thickness of layer (nm) |
|---|---|---|---|---|---|---|---|
| p-type layer | SiH$_4$<br>H$_2$<br>B$_2$H$_6$/H$_2$<br>(diluted to 10%) | 15<br>100<br>3 | 50 | 15 | 300 | Excluded | 5 |
| i-type layer | SiH$_4$<br>GeH$_4$<br>H$_2$ | 70<br>30<br>200 | 150 | 5 | 300 | RF<br>25 mW/cm$^3$<br>DC 100 V | 150 |
| n-type layer | SiH$_4$<br>H$_2$<br>PH$_3$/H$_2$<br>(diluted to 10%) | 15<br>100<br>5 | 50 | 10 | 300 | Excluded | 10 |

Comparative Example 3

The transparent electrode, the p-, i-, n-, p-, i-, and n-type layers, a reflection enhancing layer, a light reflective layer, and a backside electrode were formed on the substrate under the same manufacturing conditions as those according to Example 4 except for an arrangement in which the transparent electrode was formed on the substrate under the same conditions as those according to Comparative Example 1, so that a photovoltaic device was manufactured (device No. Comparative Example 3).

The initial characteristics and the durability characteristics of the photovoltaic device (device No. Example 4) according to Example 4 and those according to Comparative Example 3 (device No. Comparative Example 3) were measured by methods similar to those according to Example 1. As a result, the photovoltaic device according to Example 4 (device No. Example 4) exhibited a 1.07 times larger short-circuit current, an excellent series resistance 1.40 times greater, and an excellent durability characteristic 1.09 times that of the photovoltaic device according to Comparative Example 3 (device No. Comparative Example 3). Therefore, it was confirmed that the photovoltaic device (device No. Example 4) using the transparent electrode containing carbon atoms according to the present invention has excellent characteristics in comparison with those of the vention was manufactured by the vacuum evaporation method and the glow discharge decomposition method using microwaves (hereinafter abbreviated to "$\mu$W").

First, a transparent electrode, which contained carbon atoms, was formed on a substrate by using the manufacturing apparatus 500 shown in FIG. 5 and adapted to perform the vacuum evaporation method. Referring to FIG. 5, reference numeral 502 represents a 50 mm ×50 mm square substrate which was 1 mm thick and made of barium borosilicate ("7059" manufactured by Corning K.K.).

Referring to FIG. 5, reference numeral 504 represents an evaporation source composed of indium (In) and tin (Sn) contained in a molar ratio of 1:1. Reference numeral 510 represents a gas introduction valve which is connected to a $CO_2$ gas ($CO_2/O_2$) cylinder (not shown) diluted with $O_2$ gas to 50 ppm. Reference numeral 512 represents a gas introduction valve connected to an $O_2$ gas cylinder (not shown).

First, the substrate 502 was heated to 350° C. by a heater 503 and the inside of the deposition chamber 501 was exhausted by a vacuum pump (not shown) until a vacuum gauge 508 indicated a pressure of about $1 \times 10^{-5}$ Torr. At this time, the gas introduction valves 510 and 512 were gradually opened to introduce the $CO_2/O_2$ gas and the $O_2$ gas into the deposition chamber 501. In order to set the flow rate of the $CO_2/O_2$ gas at 3 sccm and the $O_2$ gas at 7 sccm at this time, corresponding mass-flow controllers 511 and 513 were used to control them. Furthermore, the opening of a (butterfly type) conductance valve 509 was adjusted while observing the vacuum gauge 508 to set the pressure in the deposition chamber 501 at 0.3 mTorr. Then, electric power was supplied from an AC power source 506 to a heater 505 to heat the evaporation source 504. Then, a shutter 507 was opened so the process of manufacturing the transparent electrode on the substrate was commenced. Simultaneously, the corresponding mass-flow controllers 511 and 513 were used to change the flow rate of the $CO_2/O_2$ gas from 3 sccm to 7 sccm and the $O_2$ gas from 7 sccm to 3 sccm at a predetermined rate. When a transparent electrode which was 70 nm thick was formed, the shutter 507 was closed and the output from the AC power source 506 was turned off. Furthermore, the gas introduction valves 510 and 512 were closed to stop the gas introduction into the deposition chamber 501. Thus, the process of manufacturing the transparent electrode containing carbon atoms was completed.

Then, the p-, i-, and n-type layers and the backside electrode were formed on the transparent electrode under the same manufacturing conditions as those according to Example 1, so that a photovoltaic device was manufactured (device No. Example 5).

Comparative Example 4

A conventional photovoltaic device was manufactured by a method similar to that according to Example 5.

First, a transparent electrode was formed on the substrate by use of the manufacturing apparatus 500 shown in FIG. 5 and adapted to perform the vacuum evaporation method.

Similarly to Example 5, the substrate 502 was heated to 350° C. by the heater 503, and the gas introduction valve 512 was gradually opened to introduce the $O_2$ gas into the deposition chamber 501 at a flow rate of 7 sccm. Then, the internal pressure of the deposition chamber 501 was adjusted to 0.3 mTorr. Then, electric power was supplied from the AC power source 506 to the heater 505 to heat the deposition source 504. Then, the shutter 507 was opened so that the process of manufacturing the transparent electrode on the substrate 502 was commenced. When a transparent electrode which was 70 nm thick was obtained, the shutter 507 was closed, the output from the AC power source 506 was turned off, and the gas introduction valve 512 was closed so as to stop the introduction of the gas into the deposition chamber 501. Thus, the process of manufacturing the transparent electrode was completed. Furthermore, the p-, i-, and n-type layers and the backside electrode were formed on the transparent electrode under the same manufacturing conditions as those according to Example 1, whereby a photovoltaic device was manufactured.

The initial characteristics and the durability characteristics of the photovoltaic devices according to Example 5 (device No. Example 5) and Comparative Example 4 (device No. Comparative Example 4) were measured by a method similar to that according to Example 1. As a result, the photovoltaic device according to Example 5 (device No. Example 5) exhibited a 1.05 times larger short-circuit current, an excellent series resistance 1.40 times larger, and excellent durability characteristics 1.08 times those of the photovoltaic device according to Comparative Example 4 (device No. Comparative Example 4). Therefore, it was confirmed that the photovoltaic device (device No. Example 5) using the transparent electrode containing carbon atoms according to the present invention has excellent characteristics in comparison with those of the conventional photovoltaic device (device No. Comparative Example 4), and therefore a beneficial effect of the present invention was confirmed.

Furthermore, the distribution of the carbon atoms in the transparent electrode according to Example 5 (device No. Example 5) was analyzed by using a secondary ionization mass analyzer ("IMS-3F" manufactured by CAMECA), which indicated the quantity of carbon atoms was apparently reduced from the portion adjacent to the p-type layer toward the substrate.

Example 6

A 50 mm ×50 mm square conductive substrate which was 1 mm thick, made of stainless steel (SUS430BA), and having mirror surfaces was used. A silver thin film serving as a light reflective layer and having a thickness of 300 nm and a ZnO thin film serving as a reflection enhancing layer and having a thickness of 1 $\mu$m were deposited by the DC magnetron sputtering method. Then, the n-, i-, and p-type layers were formed on the conductive substrate under the manufacturing conditions shown in Table 5.

TABLE 5

| Name of layer | Gas and flow rate (sccm) | | $\mu$W power (mW/cm³) | Internal pressure (mTorr) | Temperature of substrate (°C.) | Bias | Thickness of layer (nm) |
| --- | --- | --- | --- | --- | --- | --- | --- |
| n-type layer | SiH$_4$<br>H$_2$<br>PH$_3$/H$_2$<br>(diluted to 10%) | 30<br>100<br>10 | 50 | 10 | 350 | Excluded | 10 |
| i-type layer | SiH$_4$<br>H$_2$ | 100<br>200 | 100 | 5 | 350 | RF<br>100 mW/cm³<br>DC 75 V | 400 |
| p-type layer | SiH$_4$<br>H$_2$<br>B$_2$H$_6$/H$_2$<br>(diluted to 10%) | 15<br>100<br>5 | 400 | 20 | 300 | Excluded | 5 |

Then, the transparent electrode was formed on the p-type layer by a similar method to that according to Example 5. The temperature of the substrate was set at 200° C., the flow rate of the $CO_2/O_2$ gas was set at 7 sccm, the flow rate of the $O_2$ gas was set at 3 sccm and the internal pressure of the deposition chamber 501 was set at 0.3 mTorr. Then, electric power was supplied from the AC power source 506 to the heater 505 to heat the evaporation source 504, and the shutter 507 was opened so that the process of manufacturing the transparent electrode on the substrate 502 was commenced. Simultaneously, the corresponding mass flow controllers 511 and 513 were used to change the flow rate of the $CO_2/O_2$ gas from 7 sccm to 3 sccm and to change that of the $O_2$ gas from 3 sccm to 7 sccm at a predetermined rate. When a transparent electrode which was 70 nm thick was manufactured, the shutter 507 was closed, the output from the AC power source 506 was turned off, and the gas introduction valves 510 and 512 were closed to stop the introduction of the gases into the deposition chamber 501. Thus, the transparent electrode containing carbon atoms was formed on the p-type layer. Furthermore, Al was evaporated on the transparent electrode to a thickness of 2 μm to serve as a collecting electrode by vacuum evaporation, whereby a photovoltaic device was manufactured (device No. Example 6).

Comparative Example 5

A transparent electrode was formed on the p-type layer under the same conditions as those according to Comparative Example 4 except for the light reflective layer, the reflection enhancing layer, the n-, i-, and p-type layers being formed on the conductive substrate under the same conditions as those according to Example 6 and the temperature of the substrate being 200° C. Furthermore, a collecting electrode was formed similarly to Example 6, whereby another photovoltaic device was manufactured (device No. Comparative Example 5).

The initial characteristics and the durability characteristics of the photovoltaic devices according to Example 6 (device No. Example 6) and Comparative Example 5 (device No. Comparative Example 5) were measured by a method similar to that according to Example 1. As a result, the photovoltaic device according to Example 6 (device No. Example 6) exhibited a 1.06 times larger short-circuit current, an excellent series resistance 1.41 times greater, and excellent durability characteristics 1.08 times those of the photovoltaic device according to Comparative Example 5 (device No. Comparative Example 5). Therefore, it was confirmed that the photovoltaic device (device No. Example 6) using the transparent electrode containing carbon atoms according to the present invention has excellent characteristics in comparison with those of the conventional photovoltaic device (device No. Comparative Example 5), and therefore a beneficial effect of the present invention was confirmed.

Furthermore, the distribution of the carbon atoms in the transparent electrode according to Example 6 (device No. Example 6) was analyzed by using a secondary ionization mass analyzer ("IMS-3F" manufactured by CAMECA), which indicated the quantity of carbon atoms was apparently reduced from the portion adjacent to the p-type layer toward the substrate.

Example 7

A photovoltaic device according to the present invention was manufactured by the DC magnetron sputtering method and the radio frequency (hereinafter abbreviated to "RF") glow discharge and decomposition method.

First, the transparent electrode containing carbon atoms was formed on the substrate under the same forming conditions as those according to Example 1.

Figure 6:
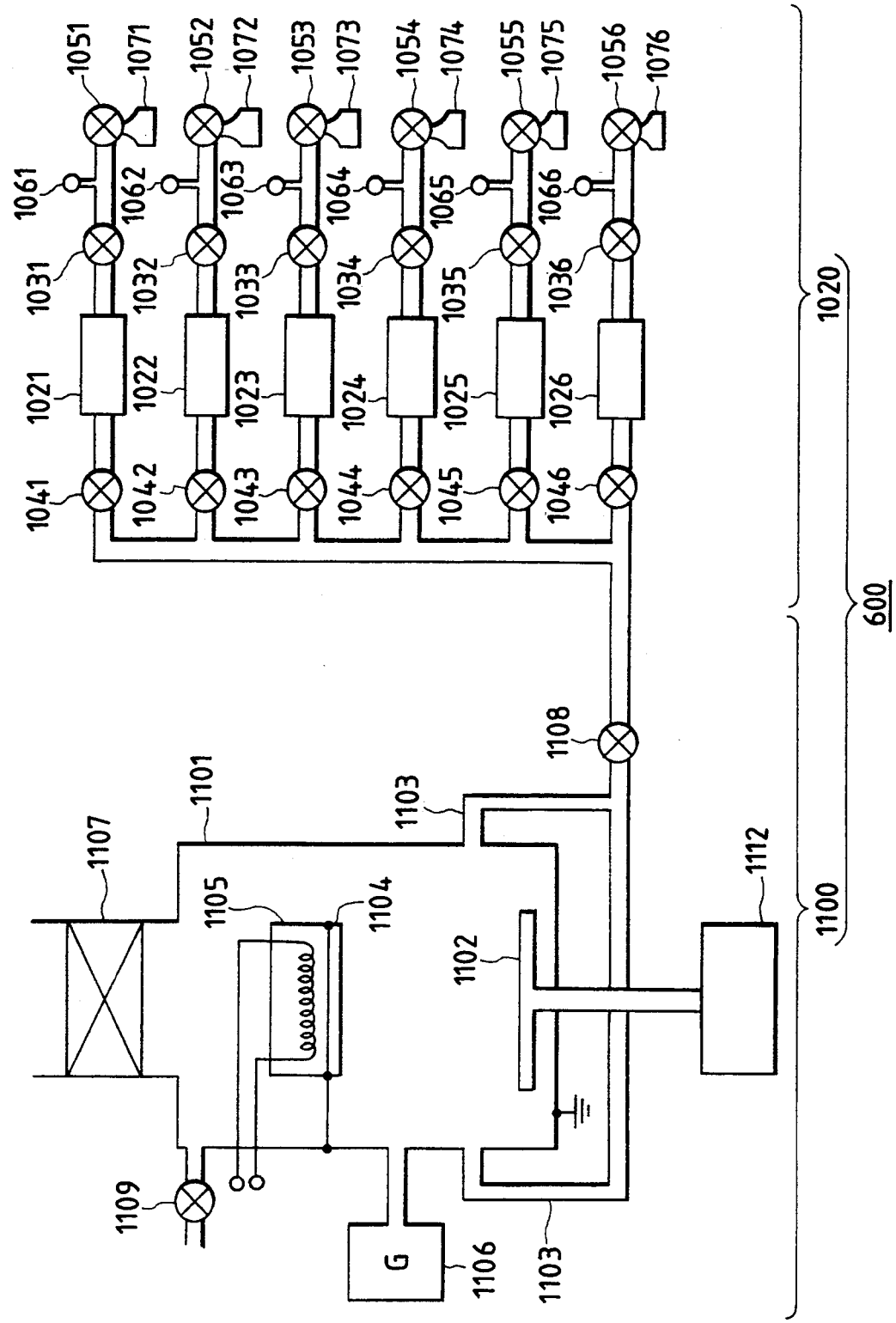
FIG. 6 is a schematic view which illustrates an example of an apparatus for manufacturing the non-single-crystal silicon semiconductor layer for the photovoltaic device according to the present invention, wherein a manufacturing apparatus which uses RF is illustrated.

Then, a manufacturing apparatus 600, composed of a raw material gas supply device section 1020 and a deposition device section 1100, as shown in FIG. 6 and adapted to perform the RF glow discharge and decomposition method, was used to form a non-single-crystal silicon semiconductor layer on the transparent electrode.

Referring to FIG. 6, reference numeral 1104 represents a substrate on which the aforementioned transparent electrode was formed.

Gas cylinders 1071 to 1076 were filled with raw material gases which were the same as those according to Example 1, and the gases were introduced into the mass-flow controllers 1021 to 1026 in a similar manner to that according to Example 1.

After preparations for forming the layers had been completed as described above, the p-, i-, and n-type layers were formed on the substrate 1104.

The p-type layer was formed in such a manner that the substrate 1104 was heated to 300° C. by the heater 1105, and the discharge valves 1041 to 1043 and the auxiliary valve 1008 were gradually opened to introduce the $SiH_4$ gas, the $H_2$ gas, and the $B_2H_6/H_2$ gas into the deposition chamber 1101 via introduction pipe 1103. The corresponding mass flow controllers 1021 to 1023 were actuated to set the flow rate of the $SiH_4$ gas at 2 sccm, the $H_2$ gas at 50 sccm and the $B_2H_6/H_2$ gas at 1 sccm. The internal pressure of the deposition chamber 1101 was set to 1 Torr by adjusting the opening of the conductance valve 1107 while observing the vacuum gauge 1106. Then, the power output of the RF power source (not shown) was set to 200 mW/cm$^3$ and the RF power was supplied to a cathode 1102 via an RF matching box 1112 so that RF glow discharge was generated and the process of manufacturing the p-type layer on the transparent electrode was commenced. When a p-type layer which was 5 nm thick was formed, the RF glow discharge was stopped, and the discharge valves 1041 to 1043 and the auxiliary valve 1108 were closed to stop the gas introduction into the deposition chamber 1101. Thus, the process of forming the p-type layer was completed.

Then, the i-type layer was formed in such a manner that the substrate 1104 was heated to 300° C. by the heater 1105. Then, the discharge valves 1041 and 1042 and the auxiliary valve 1108 were gradually opened to introduce the $SiH_4$ gas and the $H_2$ gas into the deposition chamber 1101 via the gas introduction pipe 1103. In order to set the flow rate of the $SiH_4$ gas at 2 sccm and the $H_2$ gas at 20 sccm at this time, the corresponding mass-flow controllers 1021 and 1022 were used to adjust them. The internal pressure of the deposition chamber 1101 was set at 1 Torr by adjusting the opening of the conductance valve 1107 while observing the vacuum gauge 1106. Then, the power output of the RF power source (not shown) was set to 5 mW/cm$^2$ and the RF power was supplied to the cathode 1102 via the RF matching box 1112 to generate the RF glow discharge and to commence the process of forming the i-type layer on the p-type layer. When an i-type layer which was 400 nm thick was formed, the RF glow discharge was stopped and the process of forming the i-type layer was completed.

The n-type layer was formed in such a manner that the substrate 1104 was heated to 250° C. by the heater 1105 and the discharge valve 1044 was gradually opened to introduce the SiH4 gas, the H2 gas, and the PH3/H2 gas into the deposition chamber 1101 via the gas introduction pipe 1103. In order to set the gas flow rate of the SiH4 gas at 2 sccm, the H2 gas at 20 sccm and the PH3/H2 gas at 1 sccm at this time, the corresponding mass-flow controllers 1021, 1022, and 1024 were adjusted. The internal pressure of the deposition chamber 1101 was set at 1 Torr by adjusting the opening of the conductance valve 1107 while observing the vacuum meter 1106. Then, the power output of the RF power source (not shown) was set to 5 mW/cm$^2$ and the RF power was supplied to the cathode 1102 via the RF matching box 1112 to generate the RF glow discharge. Thus, the process of forming the n-type layer on the i-type later was commenced. When an n-type layer of 10 nm thickness was formed, the RF glow discharge was stopped and the discharge valves 1041, 1042, and 1044 and the auxiliary valve 1108 were closed to stop the gas introduction into the deposition chamber 1101. Thus, the process of forming the n-type layer was completed.

When each of the aforementioned layers is formed, the discharge valves 1041 to 1046 must, of course, be closed completely except for the valves for the required gases. Furthermore, the undesirable retention of the gases in the deposition chamber 1101 and the pipes arranged from the discharge valves 1041 to 1046 to the deposition chamber 1101 is prevented by closing the discharge valves 1041 to 1046, by opening the auxiliary valve 1108 and by fully opening the conductance valve 1107 to temporarily exhaust the inside portion of the system to a high degree of vacuum if necessary.

Then, the backside electrode was formed on the n-type layer by evaporation similarly to Example 1 so that the photovoltaic device was manufactured (device No. Example 7).

The conditions for manufacturing the photovoltaic device are shown in Tables 6-1 and 6-2.

TABLE 6-1

| Substrate | Barium borosilicate glass 50 mm × 50 mm thickness 1 mm | |
|---|---|---|
| Transparent Electrode | Conditions for manufacturing by DC magnetron sputtering | |
| | Flow rate of O2 gas | 20 sccm |
| | Flow rate of Ar gas | 20 sccm |
| | Temperature of substrate | 350° C. |
| | Internal pressure | 2 mTorr |
| | Thickness of layer | 70 nm |
| | Composition of target (molar ratio) | DV voltage |

TABLE 6-1-continued

| Substrate | Barium borosilicate glass 50 mm × 50 mm thickness 1 mm | |
|---|---|---|
| | In | 85 | −400 V |
| | Sn | 15 | |
| | C | 0.005 | |
| | In | 85 | −450 V → −350 V |
| | Sn | 15 | (changed at a predetermined rate |

TABLE 6-2

| | Conditions for manufacturing layers | | | | |
|---|---|---|---|---|---|
| Name of layer | Gas and flow rate (sccm) | μW power (mW/cm$^3$) | Internal pressure (mTorr) | Temperature of substrate (°C.) | Thickness of layer (nm) |
| p-type layer | SiH4 2<br>H2 50<br>B2H6/H2 1<br>(diluted to 10%) | 200 | 1 | 300 | 5 |
| i-type layer | SiH4 2<br>H2 20 | 5 | 1 | 300 | 400 |
| n-type layer | SiH4 2<br>H2 20<br>PH3/H2 1<br>(diluted to 10%) | 5 | 1 | 250 | 10 |
| Backside Electrode | Al 2 μm | | | | |

Comparative Example 6

The p-, i-, and n-type layers and the backside electrode were formed on the transparent electrode under the same conditions as those according to Example 7 except for the transparent electrode, which was the same as that according to Comparative Example 1, whereby the photovoltaic device was manufactured (device No. Comparative Example 6).

The initial characteristics and the durability characteristics of the photovoltaic devices according to Example 7 (device No. Example 7) and Comparative Example 6 (device No. Comparative Example 6) were measured by a similar method to that according to Example 1. As a result, the photovoltaic device according to Example 7 (device No. Example 7) exhibited a 1.06 times larger short-circuit current, an excellent series resistance 1.39 times larger, and excellent durability characteristics 1.09 times larger than those of the photovoltaic device according to Comparative Example 6 (device No. Comparative Example 6). Therefore, it was confirmed that the photovoltaic device (device No. Example 7) using the transparent electrode containing carbon atoms according to the present invention has excellent characteristics in comparison with those of the conventional photovoltaic device (device No. Comparative Example 6), and therefore a beneficial effect of the present invention was confirmed.

Example 8

A photovoltaic device according to the present invention was manufactured by the DC magnetron sputtering method and the microwave (hereinafter abbreviated to "μW") glow discharge and decomposition method.

First, the transparent electrode containing nitrogen atoms was formed on the substrate by the manufacturing apparatus 300 shown in FIG. 3 and adapted to perform the DC magnetron sputtering method.

Referring to FIG. 3, reference numeral 302 represents a substrate in the form of a 50 mm × 50 mm square, which was 1 mm thick and made of barium borosilicate glass ("7059" manufactured by Corning K.K.).

In FIG. 3, reference numeral 304 represents a target made of indium (In) and tin (Sn) contained in a molar ratio of 85:15, the target 304 being insulated from the deposition chamber 301 by the insulating supporting member 305.

Reference numerals 314 to 316 represent gas introduction valves which were respectively connected to an oxygen ($O_2$) gas cylinder, an argon (Ar) gas cylinder, and a cylinder for nitrogen ($N_2$) gas (hereinafter abbreviated to "$N_2/O_2$") diluted with oxygen ($O_2$) gas to 50 ppm.

First, the substrate 302 was heated to 350° C. by the heater 303, and the deposition chamber 301 was exhausted by a vacuum pump (not shown). When the pressure reading of the vacuum gauge 312 indicated about $1 \times 10^{-5}$ Torr, the gas introduction valves 314 to 316 were gradually opened so as to introduce the $O_2$ gas, the Ar gas, and the $N_2/O_2$ gas into the deposition chamber 301. In order to set the flow rate of the $O_2$ gas at 15 sccm, the Ar gas at 20 sccm and the $N_2/O_2$ gas at 5 sccm at this time, the corresponding mass-flow controllers 317 to 319 were operated. In order to set the internal pressure of the deposition chamber 301 at 2 mTorr, the opening of the (butterfly type) conductance valve 313 was adjusted while observing the vacuum gauge 312. Then, the voltage of the DC power source 306 was set at −400 V and the DC power was supplied to the target 304 to generate a DC glow discharge. Then, the shutter 307 was opened so that the process for forming the transparent electrode on the substrate 302 was commenced. Simultaneously, in order to cause the flow rate of the $O_2$ gas to be gradually changed from 15 sccm to 5 sccm at a predetermined rate, and to cause the flow rate of the $N_2/O_2$ gas to be also gradually changed from 5 sccm to 15 sccm at a predetermined rate, the corresponding mass-flow controllers 517 and 519 were operated. When a transparent electrode having a thickness of 70 nm was formed, the shutter 307 was closed, and the output from the DC power source 306 was turned off so that the DC glow discharge was stopped. Then, the gas introduction valves 315 and 316 were closed to stop the introduction of the Ar gas and the $N_2/O_2$ gas into the deposition chamber 301. Furthermore, the internal pressure of the deposition chamber 301 was set at 1 Torr by adjusting the opening of the conductance valve 313. Then, the transparent electrode was subjected to a heat treatment for one hour whereby the process of manufacturing the transparent electrode containing nitrogen atoms was completed. Then, the semiconductor layer was manufactured by a method similar to that according to Example 1.

Then, Al was formed by vacuum evaporation on the n-type layer to a thickness of 2 μm to serve as the back-side electrode whereby a photovoltaic device was manufactured (device No. Example 8).

The above-mentioned conditions for manufacturing the photovoltaic device are shown in Tables 7-1 and 7-2.

TABLE 7-1

| Substrate | Barium borosilicate glass 50 mm × 50 mm thickness 1 mm | | | |
|---|---|---|---|---|
| Transparent Electrode | Conditions for manufacturing by DC magnetron sputtering | | | |
| | Gas and Flow Rate (sccm) | | Target | In:Sn = 85:15 |
| | | | Temperature of substrate | 350° |
| | $O_2$ (changed at a predetermined rate) | 15 → 5 | Internal pressure | 2 mTorr |
| | | | DC voltage | −400 V |
| | | | Thickness of the layer | 70 nm |
| | Ar | 20 | | |
| | $N_2/O_2$ (changed at a predetermined rate) | 5 → 15 | | |

TABLE 7-2

| | Conditions for manufacturing layers | | | | | |
|---|---|---|---|---|---|---|
| Name of layer | Gas and flow rate (sccm) | μW power (mW/cm³) | Internal pressure (mTorr) | Temperature of substrate (°C.) | Bias | Thickness of layer (nm) |
| p-type layer | $SiH_4$ 10<br>$H_2$ 100<br>$B_2H_6/H_2$ 5<br>(diluted to 10%) | 400 | 20 | 350 | Excluded | 5 |
| i-type layer | $SiH_4$ 100<br>$H_2$ 200 | 100 | 5 | 350 | RF 100 mW/cm³ DC 75 V | 400 |
| n-type layer | $SiH_4$ 30<br>$H_2$ 100<br>$PH_3/H_2$ 6<br>(diluted to 10%) | 50 | 10 | 250 | Excluded | 10 |
| Backside Electrode | Al 2 μm | | | | | |

Comparative Example 7

A conventional photovoltaic device was manufactured by a method similar to that according to Example 8.

First, the transparent electrode was formed on the substrate by the manufacturing apparatus 300 shown in FIG. 3 and adapted to perform the DC magnetron sputtering method.

Similarly to Example 8, the substrate 302 was heated to 350° C., and the $O_2$ gas was introduced into the deposition chamber 301 at 20 sccm and the argon gas was introduced at 20 sccm. Then, the internal pressure of the deposition chamber 301 was adjusted to 2 mTorr. Then, the voltage of the DC power source 310 was set to −400 V and the DC power was supplied to the target 304 to generate a DC glow discharge. Then, the shutter 307 was opened so that the process for manufacturing the transparent electrode on the substrate 302 was commenced. When a transparent electrode which was 70 nm thick was formed, the shutter 307 was turned off so that the DC glow discharge was stopped. Then, the gas introduction valve 315 was closed to stop the introduction of the Ar gas into the deposition chamber 301. Furthermore, the opening of the conductance valve 313 was adjusted to set the internal pressure of the deposition chamber 301 at 1 Torr. Then, the transparent electrode was subjected to a heat treatment for one hour, and thus the process for manufacturing the transparent electrode was completed.

Then, the p-, i-, and n-type layers and the backside electrode were formed on the transparent electrode under the same conditions as those according to Example 8, so that a photovoltaic device was manufactured (device No. Comparative Example 7).

Then, the initial characteristics and the durability of the photovoltaic devices according to Example 8 (device No. Example 8) and Comparative Example 7 (device No. Comparative Example 7) were measured.

The initial characteristics were measured in such a manner that short-circuit currents and series resistances were measured by measuring the V-I characteristics while irradiating the photovoltaic devices according to Example 8 (device No. Example 8) and Comparative Example 7 (device No. Comparative Example 7) with AM-1.5 light (10 mW/cm$^2$). As a result, the photovoltaic device according to Example 8 (device No. Example 8) exhibited an excellent short-circuit current 1.05 times that of the photovoltaic device according to Comparative Example 7 (device No. Comparative Example 7) and an excellent series resistance 1.40 times the same.

The durability was measured in such a manner that the changes in the photoelectric conversion efficiencies were evaluated after performing the following process: the photovoltaic devices according to Example 8 (device No. Example 8) and Comparative Example 7 (device No. Comparative Example 7) were allowed to stand in the dark in an atmosphere the humidity of which was 85% and subjected to 30 heat cycles each consisting of standing at a temperature of 85° C. for four hours and at a temperature of −40° C. for 30 minutes. As a result, the photovoltaic device according to Example 8 (device No. Example 8) exhibited an excellent photoelectric conversion efficiency 1.10 times that of the photovoltaic device according to Comparative Example 7 (device No. Comparative Example 7).

Furthermore, the distribution of the nitrogen atoms in the transparent electrode of the photovoltaic device according to Example 8 (device No. Example 8) was analyzed by using a secondary ionization mass analyzer ("IMS-3F" manufactured by CAMECA), resulting in the quantity of nitrogen atoms apparently being reduced from the portion adjacent to the p-type layer toward the substrate.

As a result, it was confirmed that the photovoltaic device (device No. Example 8) according to the present invention which used the transparent electrode containing nitrogen atoms has excellent characteristics in comparison with the conventional photovoltaic device (device No. Comparative Example 7) and therefore a beneficial effect of the present invention was confirmed.

Example 9

The transparent electrode, the p-, i-, and n-type layers and the backside electrode were formed on the substrate under the same conditions as those according to Example 8 except that the alloys shown in Table 8 were used as the material of the target 304, whereby several photovoltaic devices were manufactured (device No. Examples 9-1 to 9-9).

The initial characteristics and the durability of the manufactured photovoltaic devices (device No. Examples 9-1 to 9-9) were measured by similar methods to those according to Example 8. The results are shown in Table 8.

TABLE 8

| Device No. | Composition of target (mole ratio) | Short-circuit current | Series resistance | Durability characteristic |
|---|---|---|---|---|
| Example 9-1 | only In | 1.06 | 1.33 | 1.08 |
| Example 9-2 | only Sn | 1.06 | 1.32 | 1.07 |
| Example 9-3 | In:Sn = 4:1 | 1.07 | 1.39 | 1.08 |
| Example 9-4 | In:Sn = 9:1 | 1.07 | 1.38 | 1.09 |
| Example 9-5 | In:C = 100:0.001 | 1.07 | 1.36 | 1.09 |
| Example 9-6 | Sn:C = 100:0.005 | 1.07 | 1.37 | 1.08 |
| Example 9-7 | In:Sn:C = 80:20:0.007 | 1.08 | 1.40 | 1.09 |
| Example 9-8 | In:Sn:C = 85:15:0.01 | 1.08 | 1.42 | 1.09 |
| Example 9-9 | In:Sn:C = 90:10:0.003 | 1.07 | 1.41 | 1.10 |

*results of measurements were relative values with respect to Comparative Example 7 (device No. Comparative Example 7)

As can be understood from Table 8, it was confirmed that the photovoltaic devices (device No. Examples 9-1 to 9-9), containing nitrogen atoms according to the present invention have excellent characteristics in comparison with the conventional photovoltaic devices (device No. Comparative Example 7) and therefore a beneficial effect of the present invention was confirmed.

Example 10

The transparent electrode, the n-, i-, and p-type layers and the backside electrode were formed on the substrate under the same conditions as those according to Example 8 except the n-, i-, and p-type layers were formed under conditions shown in Table 9, whereby a photovoltaic device was manufactured (device No. Example 10).

TABLE 9

| | | Conditions for manufacturing layers | | | | |
|---|---|---|---|---|---|---|
| Name of layer | Gas and flow rate (sccm) | | $\mu$W power (mW/cm$^3$) | Internal pressure (mTorr) | Temperature of substrate (°C.) | Bias | Thickness of layer (nm) |
| n-type | SiH$_4$ | 10 | 350 | 15 | 350 | Excluded | 5 |

TABLE 9-continued

| Name of layer | Gas and flow rate (sccm) | | μW power (mW/cm$^3$) | Internal pressure (mTorr) | Temperature of substrate (°C.) | Bias | Thickness of layer (nm) |
|---|---|---|---|---|---|---|---|
| | H$_2$ | 100 | | | | | |
| | PH$_3$H$_2$ (diluted to 10%) | 8 | | | | | |
| i-type layer | SiH$_4$ H$_2$ | 100 200 | 100 | 5 | 350 | RF 100 mW/cm$^3$ DC 75 V | 400 |
| p-type layer | SiH$_4$ H$_2$ B$_2$H$_6$/H$_2$ (diluted to 10%) | 30 100 3 | 50 | 10 | 300 | Excluded | 15 |

Comparative Example 8

The transparent electrode, the n-, i-, and p-type layers and the backside electrode were formed on the substrate under the same conditions as those according to Example 10 except the transparent electrode was formed on the substrate under the same conditions as those according to Comparative Example 7, so that a photovoltaic device was manufactured (device No. Comparative Example 8).

The initial characteristics and the durability characteristics of the photovoltaic devices according to Example 10 (device No. Example 10) and Comparative Example 8 (device No. Comparative Example 8) were measured by a method similar to that according to Example 8. As a result, the photovoltaic device according to Example 10 (device No. example 10) exhibited a 1.06 times larger short-circuit current, an excellent series resistance 1.37 times larger, and excellent durability characteristics 1.10 times those of the photovoltaic device according to Comparative Example 8 (device No. Comparative Example 8). Therefore, it was confirmed that the photovoltaic device (device No. Example 10) using the transparent electrode containing nitrogen atoms according to the present invention has excellent characteristics in comparison with those of the conventional photovoltaic device (device No. Comparative Example 8), and therefore a beneficial effect of the present invention was confirmed.

Example 11

The transparent electrode containing nitrogen atoms was formed on the substrate under the same conditions as those according to Example 8, and the p-, i-, n-, p-, i-, and n-type layers were formed on the aforesaid transparent electrode by using the CH$_4$ gas and the GeH$_4$ gas under the conditions shown in Tables 10-1 and 10-2. Then, a ZnO thin film was formed by evaporation on the n-type layer to serve as a reflection enhancing layer by the DC magnetron sputtering method to a thickness of 1 μm. Furthermore, a silver thin film was formed to serve as a light reflective layer by the DC magnetron sputtering method to a thickness of 300 nm, and the backside electrode was formed on the silver thin film similar to Example 10, whereby a photovoltaic device was manufactured (device No. Example 11).

TABLE 10-1

| Name of layer | Gas and flow rate (sccm) | | μW power (mW/cm$^3$) | Internal pressure (mTorr) | Temperature of substrate (°C.) | Bias | Thickness of layer (nm) |
|---|---|---|---|---|---|---|---|
| p-type layer | SiH$_4$ CH$_4$ H$_2$ B$_2$H$_6$/H$_2$ (diluted to 10%) | 10 2 400 10 | 500 | 20 | 350 | RF 60 mW/cm$^3$ DC 90 V | 5 |
| i-type layer | SiH$_4$ H$_2$ | 100 200 | 50 | 1 | 350 | RF 120 mW/cm$^3$ DC 80 V | 200 |
| n-type layer | SiH$_4$ H$_2$ PH$_3$/H$_2$ (diluted to 10%) | 15 100 5 | 50 | 15 | 100 | Excluded | 5 |

TABLE 10-2

| Name of layer | Gas and flow rate (sccm) | | μW power (mW/cm$^3$) | Internal pressure (mTorr) | Temperature of substrate (°C.) | Bias | Thickness of layer (nm) |
|---|---|---|---|---|---|---|---|
| p-type layer | SiH$_4$ H$_2$ B$_2$H$_6$/H$_2$ (diluted to 10%) | 15 100 3 | 50 | 15 | 300 | Excluded | 5 |
| i-type layer | SiH$_4$ GeH$_4$ | 70 30 | 150 | 5 | 300 | RF 25 mW/cm$^3$ | 150 |

TABLE 10-2-continued

| Name of layer | Gas and flow rate (sccm) | | μW power (mW/cm³) | Internal pressure (mTorr) | Temperature of substrate (°C.) | Bias | Thickness of layer (nm) |
|---|---|---|---|---|---|---|---|
| n-type layer | $H_2$<br>$SiH_4$<br>$H_2$<br>$PH_3/H_2$<br>(diluted to 10%) | 200<br>15<br>100<br>5 | 50 | 15 | 300 | DC 100 V<br>Excluded | 10 |

Comparative Example 9

The transparent electrode, the p-, i-, n-, p-, i-, and n-type layers, the reflection enhancing layer, the light reflective layer, and a backside electrode were formed on a substrate under the same conditions as those according to Example 11 except the transparent electrode was formed on the substrate under the same conditions as those according to Comparative Example 7, whereby a photovoltaic device was manufactured (device No. Comparative Example 9).

The initial characteristics and the durability characteristics of the photovoltaic devices according to Example 11 (device No. Example 11) and Comparative Example 9 (device No. Comparative Example 9) were measured by a method similar to that according to Example 8. As a result, the photovoltaic device according to Example 11 (device No. Example 11) exhibited a 1.08 times larger short-circuit current, an excellent series resistance 1.41 times larger, and excellent durability characteristics 1.10 times those of the photovoltaic device according to Comparative Example 9 (device No. Comparative Example 9). Therefore, it was confirmed that the photovoltaic device (device No. Example 11) using the transparent electrode containing nitrogen atoms according to the present invention has excellent characteristics in comparison with those of the conventional photovoltaic device (device No. Comparative Example 9), and therefore a beneficial effect of the present invention was confirmed.

Example 12

The photovoltaic device according to the present invention was manufactured by the vacuum evaporation method and the microwave (hereinafter abbreviated to "μW") and the glow discharge and decomposition method.

First, a transparent electrode containing nitrogen atoms was formed on the substrate by the manufacturing apparatus 500 shown in FIG. 5 and adapted to perform the vacuum evaporation method.

Referring to FIG. 5, reference numeral 502 represents a substrate in the form of a 50 mm ×50 mm square which was 1 mm thick and which was made of barium borosilicate glass ("7059" manufactured by Corning).

Reference numeral 504 represents an evaporation source composed of indium (In) and tin (Sn) in a molar ratio of 1:1.

Reference numeral 510 represents a gas introduction valve which was connected to a cylinder (not shown) for $N_2/O_2$ gas obtained by diluting $N_2$ gas with $O_2$ gas to 50 ppm.

Reference numeral 512 represents a gas introduction valve which was connected to an $O_2$ gas cylinder (not shown).

First, the substrate 502 was heated to 350° C. by the heater 503, and the inside of the deposition chamber 501 was exhausted by a vacuum pump (not shown). When the pressure reading of the vacuum gauge 508 had become about $1 \times 10^{-5}$ Torr, the gas introduction valves 510 and 512 were gradually opened to introduce the $N_2/O_2$ gas and the $O_2$ gas into the deposition chamber 501. In order to set the introduction flow rate of the $N_2/O_2$ gas at 3 sccm and the $O_2$ gas at 7 sccm at this time, the corresponding mass-flow controllers 511 and 513 were operated. Furthermore, the internal pressure of the deposition chamber 501 was set at 0.3 mTorr by adjusting the opening of the (butterfly type) conductance valve 509 while observing the vacuum gauge 508. Then, electric power was supplied from the AC power source 506 to the heater 505 to heat the evaporation source 504. Then, the shutter 507 was opened to commence the process for manufacturing the transparent electrode on the substrate 502. Simultaneously, the introduction of the $N_2/O_2$ gas was changed from 3 sccm to 7 sccm at a predetermined rate and the $O_2$ gas was changed from 7 sccm to 3 sccm at a predetermined rate by operating the corresponding mass-flow controllers 511 and 513. When a transparent electrode which was 70 nm thick was formed, the shutter 507 was closed, the output from the AC power source 506 was turned off and the gas introduction valves 510 and 512 were closed, whereby the gas introduction into the deposition chamber 501 was stopped. Thus, a transparent electrode containing nitrogen atoms was manufactured.

Then, the p-, i-, and n-type layers and the backside electrode were formed on the transparent electrode under the same conditions as those according to Example 8, whereby a photovoltaic device was manufactured (device No. Example 12).

Comparative Example 10

A conventional photovoltaic device was manufactured by a method similar to that according to Example 12.

First, the transparent electrode was formed on the substrate by the manufacturing apparatus 500 shown in FIG. 5 and adapted to perform the vacuum evaporation method.

Similarly to Example 5, the substrate 502 was heated to 350° C. by the heater 503, and the gas introduction valve 512 was gradually opened to introduce the $O_2$ gas into the deposition chamber 501 at 10 sccm. Furthermore, the internal pressure of the deposition chamber 501 was set at 0.3 mTorr. Then, electric power was supplied from the AC power source 506 to the heater 505 to heat the evaporation source 504. Then, the shutter 507 was opened so that the process for manufacturing the transparent electrode on the substrate 502 was commenced. When a transparent electrode which was 70 nm thick was formed, the shutter 507 was closed and the output from the AC power source 506 was turned off. Furthermore, the gas introduction valve 512 was closed to stop the gas introduction into the deposition chamber 501. Thus, the process for manufacturing the transparent electrode was completed. Furthermore, the p-, i-, and n-type layer and the backside electrode were formed on the transparent electrode under the same conditions as those according to Example 1, whereby a photovoltaic device was manufactured (device No. Comparative Example 10).

The initial characteristics and the durability characteristics of the photovoltaic devices according to Example 12 (device No. Example 12) and Comparative Example 10 (device No. Comparative Example 10) were measured by a method similar to that according to Example 8. As a result, the photovoltaic device according to Example 12 (device No. Example 12) exhibited a 1.07 times larger short-circuit current, an excellent series resistance 1.42 times larger, and excellent durability characteristics 1.10 times those of the photovoltaic device according to Comparative Example 10 (device No. Comparative Example 10). Therefore, it was confirmed that the photovoltaic device (device No. Example 5) using the transparent electrode containing nitrogen atoms according to the present invention has excellent characteristics in comparison with those of the conventional photovoltaic device (device No. Comparative Example 4), and therefore a beneficial effect of the present invention was confirmed.

Furthermore, the distribution of the nitrogen atoms in the transparent electrode of the photovoltaic device according to Example 12 (device No. Example 12) was analyzed by using a secondary ionization mass analyzer ("IMS-3F" manufactured by CAMECA), resulting in the quantity of nitrogen atoms apparently being reduced from the portion adjacent to the p-type layer toward the substrate.

Example 13

A 50 mm ×50 mm square conductive substrate which was 1 mm thick, made of stainless steel (SUS43-0BA) and having mirror surfaces was used. A silver thin film serving as a light reflective layer and having a thickness of 300 nm and a ZnO thin film serving as a reflection enhancing layer and having a thickness of 1 $\mu$m were sequentially formed thereon by the DC magnetron sputtering method. Then, the n-, i-, and p-type layers were formed on the conductive substrate under the manufacturing conditions shown in Table 11.

Then, the transparent electrode was formed on the p-type layer by a method similar to that according to Example 12. The temperature of the substrate was set at 200° C., the flow rate of the $N_2/O_2$ gas was set at 7 sccm, the flow rate of the $O_2$ gas was set at 3 sccm and the internal pressure of the deposition chamber 501 was set at 0.3 mTorr. Then, electric power was supplied from the AC power source 506 to the heater 505 to heat the evaporation source 504, and the shutter 507 was opened so that the process of manufacturing the transparent electrode on the substrate 502 was commenced. Simultaneously, the corresponding mass-flow controllers 511 and 513 were used to change the rate of the $N_2/O_2$ gas from 7 sccm to 3 sccm at a predetermined rate and to change that of the $O_2$ gas from 3 sccm to 7 sccm at a predetermined rate. When a transparent electrode which was 70 nm thick was formed, the shutter 507 was closed, the output from the AC power source 506 was turned off, and the gas introduction valves 510 and 512 were closed to stop the introduction of the gases into the deposition chamber 501. Thus, a transparent electrode containing nitrogen atoms was formed on the p-type layer. Furthermore, Al was evaporated on the transparent electrode to a thickness of 2 $\mu$m to serve as a collecting electrode by vacuum evaporation, whereby a photovoltaic device was manufactured (device No. Example 13).

Comparative Example 11

A transparent electrode was formed on a p-type layer under the same conditions as those according to Comparative Example 10 except that the light reflective layer, the reflection enhancing layer, the n-, i-, and p-type layers were formed on the conductive substrate under the same manufacturing conditions as those according to Example 13 and the temperature of the substrate was made to be 200° C. Furthermore, the collecting electrode was formed similarly to Example 13, whereby a photovoltaic device was manufactured (device No. Comparative Example 11).

The initial characteristics and the durability characteristics of the photovoltaic devices according to Example 13 (device No. Example 13) and Comparative Example 11 (device No. Comparative Example 11) were measured by a similar method to that according to Example 8. As a result, the photovoltaic device according to Example 13 (device No. Example 13) exhibited a 1.07 times larger short-circuit current, an excellent series resistance 1.44 times larger, and excellent durability characteristics 1.11 times those of the photovoltaic device according to Comparative Example 11 (device No. Comparative Example 11). Therefore, it was confirmed that the photovoltaic device (device No. Example 13) using the transparent electrode containing nitrogen

TABLE 11

| Name of layer | Gas and flow rate (sccm) | | $\mu$W power (mW/cm$^3$) | Internal pressure (mTorr) | Temperature of substrate (°C.) | Bias | Thickness of layer (nm) |
| --- | --- | --- | --- | --- | --- | --- | --- |
| n-type layer | SiH$_4$<br>H$_2$<br>PH$_3$H$_2$<br>(diluted to 10%) | 30<br>100<br>10 | 50 | 10 | 350 | Excluded | 10 |
| i-type layer | SiH$_4$<br>H$_2$ | 100<br>200 | 100 | 5 | 350 | RF<br>100 mW/cm$^3$<br>DC 75 V | 400 |
| p-type layer | SiH$_4$<br>H$_2$<br>B$_2$H$_6$/H$_2$<br>(diluted to 10%) | 10<br>100<br>5 | 400 | 20 | 300 | Excluded | 5 | atoms according to the present invention has excellent characteristics in comparison with those of the conventional photovoltaic device (device No. Comparative Example 11), and therefore a beneficial effect of the present invention was confirmed.

Furthermore, the distribution of the nitrogen atoms in the transparent electrode of the photovoltaic device according to Example 13 (device No. Example 13) was analyzed by using a secondary ionization mass analyzer ("IMS-3F" manufactured by CAMECA), resulting in the quantity of nitrogen atoms being considerably reduced from the portion adjacent to the p-type layer toward the substrate.

Example 14

The photovoltaic device according to the present invention was manufactured by the DC magnetron sputtering method and the radio frequency (hereinafter abbreviated to "RF") glow discharge and decomposition method.

First, a transparent electrode containing nitrogen atoms was formed on the substrate under the same manufacturing conditions as those according to Example 8.

Then, the manufacturing apparatus 600, composed of the raw material gas supply device portion 1020 and the deposition device portion 1100, as shown in FIG. 6 and adapted to perform the RF glow discharge and decomposition method, was used to manufacture the non-single-crystal silicon semiconductor layer on the transparent electrode.

Referring to FIG. 6, reference numeral 1104 represents a substrate on which the aforementioned transparent electrode was formed.

The gas cylinders 1071 to 1076 respectively were filled with the raw material gases which are the same as those according to Example 8, and the aforementioned gases were introduced into the mass-flow controllers 1021 to 1026 in a similar operation manner to that according to Example 8.

After the preparations for forming the layers had been completed as described above, the p-, i-, and n-type layers were formed on the substrate 1104.

The p-type layer was manufactured in such a manner that the substrate 1104 was heated to 300° C. by the heater 1105, and the discharge valves 1041 to 1043 and the auxiliary valve 1108 were gradually opened, so that the $SiH_4$ gas, the $H_2$ gas and the $B_2H_6/H_2$ gas were introduced into the deposition chamber 1101 via the gas introduction pipe 1103. In order to set the introduction flow rate of the $SiH_4$ gas at 2 sccm, the $H_2$ gas at 50 sccm and that of the $B_2H_6/H_2$ gas at 1 sccm at this time, the corresponding mass-flow controllers 1021 to 1023 were operated. The internal pressure of the deposition chamber 1101 was set at 1 Torr by adjusting the opening of the conductance valve 1107 while observing the vacuum gauge 1106. Then, the output power of the RF power source (not shown) was set to 200 mW/cm$^3$, and the RF power was supplied to the cathode 1102 via the RF matching box 1112 to generate the RF glow discharge. Thus, the process of forming the p-type layer on the transparent electrode was commenced. When a p-type layer which was 5 nm thick was formed, the RF glow discharge was stopped and the discharge valves 1041 to 1043 and the auxiliary valve 1108 were closed to stop the introduction of gas into the deposition chamber 1101. Thus, the process of forming the p-type layer was completed.

Then, the i-type layer was formed in such a manner that the substrate 1104 was heated to 300° C. by the heater 1105, and the discharge valves 1041 and 1042 and the auxiliary valve 1108 were gradually opened to introduce the $SiH_4$ gas and the $H_2$ gas into the deposition chamber 1101 via the gas introduction pipe 1103. In order to set the flow rate of the $SiH_4$ gas at 2 sccm and the $H_2$ gas at 20 sccm at this time, the corresponding mass-flow controllers 1021 and 1022 were operated. In order to set the internal pressure of the deposition chamber 1101 at 1 Torr, the opening of the conductance valve 1107 was adjusted while observing the vacuum gauge 1106. Then, the output power of an RF power source (not shown) was set to 5 mW/cm$^3$, and the RF power was supplied to the cathode 1102 via the RF matching box 1112 to generate the RF glow discharge. As a result, the process of forming the i-type layer on the p-type layer was commenced. When an i-type layer which was 400 nm thick was formed, the RF glow discharge was stopped and the process of forming the i-type layer was completed.

Then, the n-type layer was formed in such a manner that the substrate 1104 was heated to 250° C. by the heater 1105, and the discharge valve 1044 was gradually opened so as to introduce the $SiH_4$ gas, the $H_2$ gas and the $PH_3/H_2$ gas into the deposition chamber 1101 via gas introduction pipe 1103. In order to set the flow rate of the $Si_4$ gas at 2 sccm, the $H_2$ gas at 20 sccm and the $PH_3/H_2$ gas at 1 sccm at this time, the corresponding mass-flow controllers 1021, 1022 and 1024 were operated. The internal pressure of the deposition chamber 1101 was set at 1 Torr by adjusting the opening of the conductance valve 1107 while observing the vacuum gauge 1106. Then, the output power of an RF power source (not shown) was set to 5 mW/cm$^3$, and the RF power was supplied to the cathode 1102 via the RF matching box 1112 to generate the RF glow discharge. Thus, the process of forming the n-type layer on the i-type layer was commenced. When an n-type layer which was 10 nm thick was formed, the RF glow discharge was stopped and the discharge valves 1041, 1042, and 1044 and the auxiliary valve 1108 were closed to stop the introduction of gas into the deposition chamber 1101. Thus, the process of manufacturing the n-type layer was completed.

When each of the aforementioned layers was formed, the discharge valves 1041 to 1046 must, of course, be closed completely except for the valves for the required gases. Furthermore, the undesirable retention of the gases in the deposition chamber 1101 and the pipes arranged from the discharge valves 1041 to 1046 to the deposition chamber 1101 is prevented by closing the discharge valves 1041 to 1046, by opening the auxiliary valve 1108, and by fully opening the conductance valve 1107 to temporarily exhaust the inside portion of the system to a high degree of vacuum if necessary.

Then, the backside electrode was formed on the n-type layer by evaporation, similarly to Example 1, so that a photovoltaic device was manufactured (device No. Example 14).

The conditions for manufacturing the photovoltaic device are shown in Tables 12-1 and 12-2.

TABLE 12-1

| Substrate | Barium borosilicate glass 50 mm × 50 mm thickness 1 mm | | | |
|---|---|---|---|---|
| Transparent Electrode | Conditions for manufacturing by DC magnetron sputtering | | | |
| | Gas and Flow Rate (sccm) | | Target | In:Sn = 85:15 |
| | | | Temperature of substrate | 350° |
| | $O_2$ (changed at a predetermined rate) | 15 → 5 | Internal pressure | 2 mTorr |
| | | | DC voltage | −400 V |
| | | | Thickness of the layer | 70 nm |
| | Ar | 20 | | |
| | $N_2/O_2$ (changed at a predetermined rate) | 5 → 15 | | |

TABLE 12-2

Conditions for manufacturing layers

| Name of layer | Gas and flow rate (sccm) | | μW power (mW/cm³) | Internal pressure (mTorr) | Temperature of substrate (°C.) | Thickness of layer (nm) |
|---|---|---|---|---|---|---|
| p-type layer | $SiH_4$<br>$H_2$<br>$B_2H_6/H_2$<br>(diluted to 10%) | 2<br>50<br>1 | 200 | 1 | 300 | 5 |
| i-type layer | $SiH_4$<br>$H_2$ | 2<br>20 | 5 | 1 | 300 | 400 |
| n-type layer | $SiH_4$<br>$H_2$<br>$PH_3/H_2$<br>(diluted to 10%) | 2<br>20<br>1 | 5 | 1 | 250 | 10 |
| Backside Electrode | Al | 2 μm | | | | |

Comparative Example 12

The p-, i-, and n-type layers and the backside electrode were formed on a transparent electrode under the same conditions as those according to Example 14 except that a transparent electrode which was the same as that according to Comparative Example 7 was used, whereby a photovoltaic device was manufactured (device No. Comparative Example 12).

The initial characteristics and the durability characteristics of the photovoltaic devices according to Example 14 (device No. Example 14) and Comparative Example 12 (device No. Comparative Example 12) were measured by a method similar to that according to Example 8. As a result, the photovoltaic device according to Example 14 (device No. Example 14) exhibited a 1.07 times larger short-circuit current, an excellent series resistance 1.41 times larger, and excellent durability characteristics 1.10 times those of the photovoltaic device according to Comparative Example 12 (device No. Comparative Example 12). Therefore, it was confirmed that the photovoltaic device (device No. Example 14) using the transparent electrode containing nitrogen atoms according to the present invention has excellent characteristics in comparison with those of the conventional photovoltaic device (device No. Comparative Example 12), and therefore a beneficial effect of the present invention was confirmed.

In the transparent electrodes according to the aforementioned examples, nitrogen atoms were distributed in an exponential manner in a region of 30 to 500 Å in the direction of the thickness, and the maximum density was 5 to 1000 ppm.

The photovoltaic device, composed of a non-single-crystal silicon semiconductor layer and having a transparent electrode containing carbon atoms or nitrogen atoms or both carbon atoms and nitrogen atoms, exhibited beneficial effects in that the series resistance relating to the transparent electrode was reduced and the transmissivity was improved. Furthermore, the adhesion between the semiconductor layer and the transparent electrode was improved, causing leakage to be prevented even if it is used for a long time. As a result, the durability characteristics of the photovoltaic device were improved.

In addition, since a large quantity of carbon atoms, nitrogen atoms, or both carbon atoms and nitrogen atoms is distributed in the transparent electrode in the portion adjacent to the semiconductor layer, the structural distortion which normally takes place due to the difference in the materials between the transparent electrode and the semiconductor layer can be satisfactorily prevented.

Although the present invention has been described with reference to the specific examples, it should be understood that various modifications and variations can be easily made by those skilled in the art without departing from the spirit of the invention. Accordingly, the foregoing disclosure should be interpreted as illustrative only and not in a limiting sense. The present invention is limited only by the scope of the following claims.

What is claimed is:

1. A photovoltaic device comprising:
    a conductive member;
    a semiconductor layer formed on said conductive member, made of a non-single-crystal semiconductor material containing at least silicon atoms; and
    a transparent electrode stacked on said semiconductor layer, wherein
    said transparent electrode is made of conductive oxide containing carbon atoms, and said carbon atoms are contained in larger quantities in the portion of said transparent electrode adjacent to said semiconductor layer.

2. A photovoltaic device according to claim 1, wherein said oxide is an indium oxide, a tin oxide, or an indium-tin oxide.

3. A photovoltaic device according to claim 1, wherein said semiconductor layer is formed by stacking a p-type layer, an i-type layer, and an n-type layer.

4. A photovoltaic device according to claim 1, wherein said non-single-crystal semiconductor material is an amorphous semiconductor material.

5. A photovoltaic device according to claim 1, wherein said non-single-crystal semiconductor material is a polycrystal semiconductor material.

6. A photovoltaic device according to claim 1, wherein said carbon atoms are distributed to decrease in concentration from the boundary between said transparent electrode and said semiconductor layer toward said transparent electrode in a substantially exponential manner.

7. A photovoltaic device according to claim 1, wherein the maximum concentration of said carbon atoms is 5 ppm to 1000 ppm.

8. A photovoltaic device according to claim 1, wherein said carbon atoms are, in an exponentially increasing manner, distributed in a region of 30 to 500 Å in the direction of the thickness of said electrode.

9. A photovoltaic device comprising:
a conductive member;
a non-single-crystal semiconductor containing silicon atoms on said conductive member; and
a transparent electrode stacked on said semiconductor layer, wherein said device is prepared by a process comprising the steps of forming said non-single-crystal semiconductor and forming said transparent electrode which is made of a conductive oxide containing nitrogen atoms, adjacent to said non-single-crystal semiconductor,
wherein said nitrogen atoms are contained in larger quantities in the portion of said transparent electrode adjacent to said non-single-crystal semiconductor.

10. A photovoltaic device according to claim 9, wherein said oxide is an indium oxide, a tin oxide, or an indium-tin oxide.

11. A photovoltaic device according to claim 9, wherein said semiconductor layer is formed by stacking a p-type layer, an i-type layer, and an n-type layer.

12. A photovoltaic device according to claim 9, wherein said non-single-crystal semiconductor material is an amorphous semiconductor material.

13. A photovoltaic device according to claim 9, wherein said non-single-crystal semiconductor material is a polycrystal semiconductor material.

14. A photovoltaic device according to claim 9, wherein said nitrogen atoms are distributed to decrease in concentration from the boundary between said transparent electrode and said semiconductor layer toward said transparent electrode in a substantially exponential manner.

15. A photovoltaic device according to claim 9, wherein the maximum concentration of said nitrogen atoms is 5 ppm to 1000 ppm.

16. A photovoltaic device according to claim 9, wherein said nitrogen atoms are, in an exponentially increasing manner, distributed in a region of 30 to 500 Å in the direction of the thickness of said electrode.

17. A photovoltaic device comprising:
a conductive member;
a semiconductor layer formed on said conductive member, made of a non-single-crystal semiconductor material containing at least silicon atoms; and
a transparent electrode stacked on said semiconductor layer, wherein
said transparent electrode is made of a conductive oxide containing carbon atoms and nitrogen atoms, and said carbon atoms and said nitrogen atoms are contained in larger quantities in the portion of said transparent electrode adjacent to said semiconductor layer.

18. A photovoltaic device according to claim 17, wherein said oxide is an indium oxide, a tin oxide, or an indium-tin oxide.

19. A photovoltaic device according to claim 17, wherein said semiconductor layer is formed by stacking a p-type layer, an i-type layer, and an n-type layer.

20. A photovoltaic device according to claim 17, wherein said non-single-crystal semiconductor material is an amorphous semiconductor material.

21. A photovoltaic device according to claim 17, wherein said non-single-crystal semiconductor material is a polycrystal semiconductor material.

22. A photovoltaic device according to claim 17, wherein said carbon atoms and said nitrogen atoms are distributed to decrease in concentration from the boundary between said transparent electrode and said semiconductor layer toward said transparent electrode in a substantially exponential manner.

23. A photovoltaic device according to claim 17, wherein the maximum concentration of each of said carbon atoms and said nitrogen atoms is 5 ppm to 1000 ppm.

24. A photovoltaic device according to claim 17, wherein said carbon atoms and said nitrogen atoms are, in an exponentially increasing manner, distributed in a region of 30 to 500 Å in the direction of the thickness of said electrode.

25. A photovoltaic device according to claim 17, wherein the concentration of said carbon atoms is 100 ppm or less.

* * * * *